US012733536B2

(12) United States Patent
Inutsuka et al.

(10) Patent No.: US 12,733,536 B2
(45) Date of Patent: Sep. 8, 2026

(54) ELEMENT PACKAGE AND SEMICONDUCTOR DEVICE

(71) Applicant: DENSO CORPORATION, Kariya-city (JP)

(72) Inventors: Yoshihiro Inutsuka, Kariya-city (JP); Takahiro Nakano, Kariya-city (JP); Masayuki Takenaka, Kariya-city (JP); Naohito Mizuno, Kariya-city (JP); Seigo Osawa, Kariya-city (JP); Yasushi Okura, Kariya-city (JP)

(73) Assignee: DENSO CORPORATION, Kariya-city (JP)

(*) Notice: Subject to any disclaimer, the term of this patent is extended or adjusted under 35 U.S.C. 154(b) by 719 days.

(21) Appl. No.: 18/175,263

(22) Filed: Feb. 27, 2023

(65) Prior Publication Data

US 2023/0223310 A1 Jul. 13, 2023

Related U.S. Application Data

(63) Continuation of application No. PCT/JP2021/029318, filed on Aug. 6, 2021.

(30) Foreign Application Priority Data

Sep. 1, 2020 (JP) ................................ 2020-146986

(51) Int. Cl.
*H10W 74/10* (2026.01)
*H10W 20/40* (2026.01)
(Continued)

(52) U.S. Cl.
CPC ......... *H10W 74/127* (2026.01); *H10W 20/40* (2026.01); *H10W 40/22* (2026.01); (Continued)

(58) Field of Classification Search
CPC ... H10W 74/127; H10W 20/40; H10W 40/22; H10W 70/421; H10W 74/134; H10W 74/40
See application file for complete search history.

(56) References Cited

U.S. PATENT DOCUMENTS 9,679,855 B1 * 6/2017 Lee .................... H10W 42/121
2004/0089942 A1 * 5/2004 Mamitsu ............ H10W 76/138 257/E23.092

(Continued)

FOREIGN PATENT DOCUMENTS

JP 2015-168711 A 9/2015
JP 2020-077743 A 5/2020

*Primary Examiner* — Eugene Lee
(74) *Attorney, Agent, or Firm* — Posz Law Group, PLC

(57) ABSTRACT

An element package includes a semiconductor element, a redistribution layer, a sealing resin body, and an insulating portion. The semiconductor element includes a semiconductor substrate having an element region and a scribe region, a main electrode and a pad disposed on a surface of the semiconductor substrate, and a protective film disposed above the element region on the surface of the semiconductor substrate. The sealing resin body seals the semiconductor element while exposing the main electrode and the pad. The insulating portion is disposed above the scribe region on the surface of the semiconductor element with a height not to exceed an outer peripheral edge portion of an upper surface of the protective film on the element region. The redistribution layer extends over the protective film and the insulating portion above the scribe region.

11 Claims, 8 Drawing Sheets

(51) Int. Cl.

| | |
|---|---|
| ***H10W 40/22*** | (2026.01) |
| ***H10W 70/40*** | (2026.01) |
| ***H10W 74/40*** | (2026.01) |
| *H10W 70/60* | (2026.01) |

(52) U.S. Cl.

CPC ....... *H10W 70/421* (2026.01); *H10W 74/134* (2026.01); *H10W 74/40* (2026.01); *H10W 70/60* (2026.01)

(56) References Cited

U.S. PATENT DOCUMENTS

| | | | | |
|---|---|---|---|---|
| 2006/0141669 | A1* | 6/2006 | Wakabayashi ...... | H10W 70/614<br>257/E23.178 |
| 2011/0169159 | A1* | 7/2011 | Lin ..................... | H10W 20/023<br>257/692 |
| 2011/0241222 | A1 | 10/2011 | Sezi et al. | |
| 2012/0156830 | A1* | 6/2012 | Lachner ................ | H10W 40/22<br>257/E21.599 |
| 2016/0240453 | A1* | 8/2016 | Wu ..................... | H10W 74/129 |
| 2018/0090337 | A1 | 3/2018 | Umeda | |
| 2018/0151465 | A1 | 5/2018 | Choi et al. | |
| 2020/0220474 | A1* | 7/2020 | Ji .......................... | H02M 3/158 |
| 2023/0163054 | A1* | 5/2023 | Oosawa .............. | H10W 70/461<br>257/675 |

* cited by examiner 1
9
9
9
4
6
7
11
12
9H
10
3a
U
3
2
5
V
W
9L
3a
3a
8

71
III
70
20
60b
30c
30
60
30b
41
40
Y
X
30d
72
III

FIG. 5
40
41
VI
410
413
411a
41S
411
45
411b
41P
45a
44P
42
Y
X
VI
440P
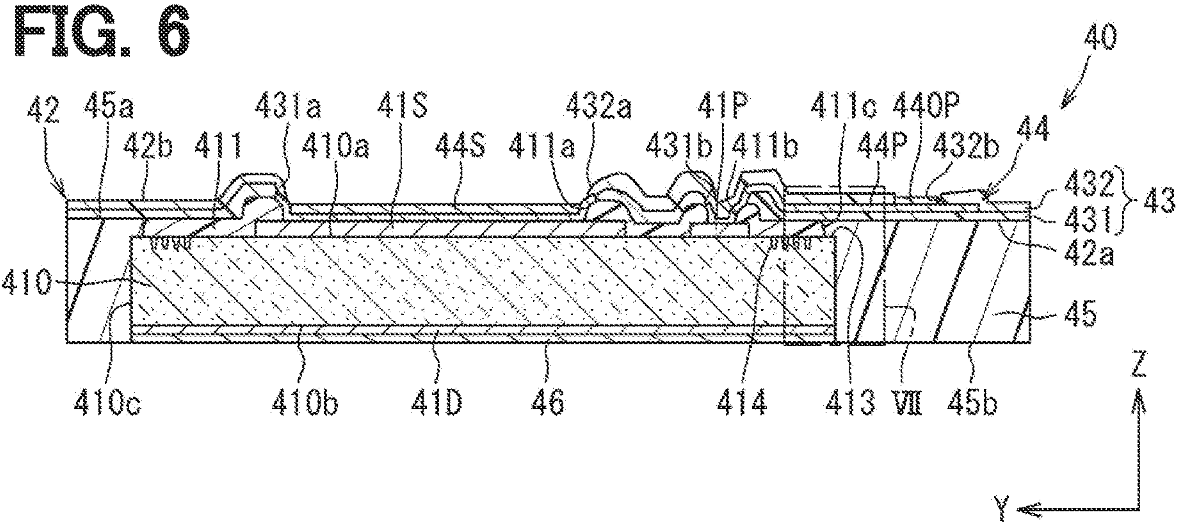
FIG. 6
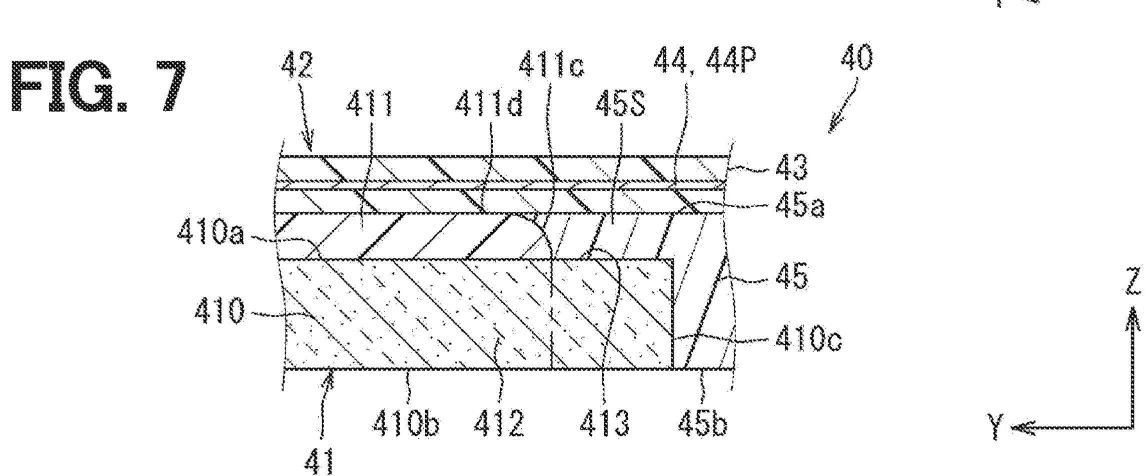
FIG. 7

ELEMENT PACKAGE AND SEMICONDUCTOR DEVICE

CROSS REFERENCE TO RELATED APPLICATIONS

The present application is a continuation application of International Patent Application No. PCT/JP2021/029318 filed on Aug. 6, 2021, which designated the U.S. and claims the benefit of priority from Japanese Patent Application No. 2020-146986 filed on Sep. 1, 2020. The entire disclosures of all of the above applications are incorporated herein by reference.

TECHNICAL FIELD

The present disclosure relates to an element package, and a semiconductor device having the element package.

BACKGROUND

An element package may include a semiconductor element, a redistribution layer, and a sealing resin body. Such an element package is, for example, disclosed in JP 2020-77743 A. The disclosure of JP 2020-77743 A is incorporated herein by reference as an explanation of technical elements of the present disclosure.

SUMMARY

The present disclosure describes an element package including a semiconductor element, a sealing resin body sealing the semiconductor element while exposing a main electrode and a pad of the semiconductor element, and a redistribution layer disposed adjacent to a surface of the semiconductor element with improved flatness. The present disclosure also describes a semiconductor device having such an element package.

BRIEF DESCRIPTION OF DRAWINGS

Objects, features and advantages of the present disclosure will become more apparent from the following detailed description made with reference to the accompanying drawings, in which:

FIG. 5 is a diagram showing a plan view of an element package having the semiconductor element;

FIG. 6 is a diagram showing a cross-sectional view taken along a line VI-VI in FIG. 5;

FIG. 7 is a diagram showing an enlarged view of a part VII in FIG. 6;

DETAILED DESCRIPTION

Figure 1:
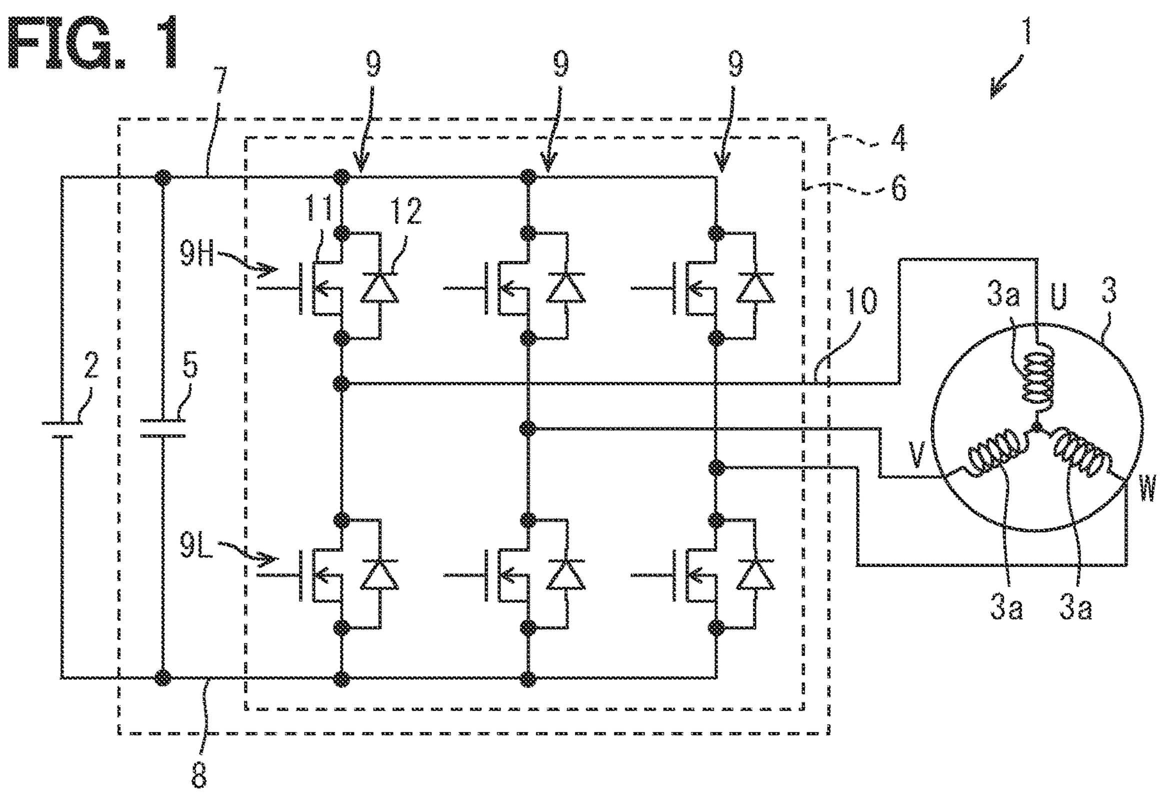
FIG. 1 is a diagram showing a circuit configuration of a power conversion device to which a semiconductor device according to a first embodiment is applied.

For example, a semiconductor element such as a power element has a main electrode and a pad adjacent to one surface of a semiconductor substrate. A protective film is disposed on the one surface of the semiconductor substrate, and the main electrode and the pad are exposed through openings of the protective film to be able to connect to a redistribution layer. The protective film is not arranged on a scribe region of the semiconductor element. In such a configuration, the redistribution layer needs to be formed at a stepped structure portion between an upper surface of the protective film and the one surface above the scribe region of the semiconductor substrate. In view of the above, or in other aspects not mentioned, there are needs for further improvements in such an element package.

The present disclosure describes an element package and a semiconductor device having the element package, which are capable of improving the flatness of a redistribution layer.

According to a first aspect of the present disclosure, an element package includes a semiconductor element, a sealing resin body, a redistribution layer, and an insulating portion. The semiconductor element has a semiconductor substrate, a main electrode, a pad, and a protective film. The main electrode and the pad are disposed on a surface of the semiconductor substrate. The semiconductor substrate has an element region formed with an element and a scribe region disposed at a predetermined area from an end portion of the semiconductor substrate and surrounding the element region. The protective film is disposed above the element region on the surface of the semiconductor substrate, and the main electrode and the pad are exposed from the protective film. The sealing resin body seals the semiconductor element, so that the main electrode and the pad are exposed from the sealing resin body. The redistribution layer is disposed adjacent to the surface of the semiconductor substrate with respect to the semiconductor element. The redistribution layer includes an insulator and a wiring disposed in the insulator. The insulating portion is disposed above the scribe region on the surface of the semiconductor element with a height without exceeding an outer peripheral edge portion of an upper surface of the protective film. The redistribution layer is disposed over the protective film and the insulating portion.

In the element package according to the first aspect, the insulating portion is disposed above the scribe region. The insulating portion has the height that does not exceed the outer peripheral edge portion of the upper surface of the protective film. The redistribution layer is disposed over the protective film and the insulating portion. Therefore, the flatness of the redistribution layer can be improved, as compared with a configuration in which the insulating portion is not arranged.

According to a second aspect of the present disclosure, an element package includes a semiconductor element, a sealing resin body, and a redistribution layer. The semiconductor element has a semiconductor substrate, a main electrode, and a pad. The main electrode and the pad are disposed on a surface of the semiconductor substrate. The semiconductor substrate has an element region formed with an element and a scribe region disposed in a predetermined area from an end portion of the semiconductor substrate and surrounding the element region. The sealing resin body seals the semiconductor element, so that the main electrode and the pad are exposed from the sealing resin body. The redistribution layer is disposed adjacent to the surface of the semiconductor substrate with respect to the semiconductor element. The redistribution layer includes an insulator and a wiring disposed in the insulator. The insulator is in contact with the surface of the semiconductor substrate over the element region and the scribe region.

In the element package according to the second aspect, the insulator of the redistribution layer is in contact with the surface of the semiconductor substrate over the element region and the scribe region. In other words, the semiconductor element does not have the protective film. Also in such a configuration, the flatness of the redistribution layer can be improved.

According to a third aspect of the present disclosure, a semiconductor device includes an element package, a heat dissipation member, and a signal terminal. The element package includes a semiconductor element, a sealing resin body, a redistribution layer, and an insulating portion. The semiconductor element has a semiconductor substrate, a main electrode, a pad, and a protective film. The main electrode and the pad are disposed on a surface of the semiconductor substrate. The semiconductor substrate has an element region formed with an element and a scribe region disposed at a predetermined area from an end portion of the semiconductor substrate and surrounding the element region. The protective film is disposed above the element region on the surface of the semiconductor substrate, so that the main electrode and the pad are exposed from the protective film. The sealing resin body seals the semiconductor element, so that the main electrode and the pad are exposed from the sealing resin body. The redistribution layer is disposed adjacent to the surface of the semiconductor substrate with respect to the semiconductor element. The redistribution layer includes an insulator and a wiring disposed in the insulator. The insulating portion is disposed above the scribe region on the surface of the semiconductor element with a height without exceeding an outer peripheral edge portion of an upper surface of the protective film. The redistribution layer is disposed over the protective film and the insulating portion. The wiring includes a signal wiring connected to the pad. The signal wiring is disposed to extend over a boundary between the element region and the scribe region in a plan view of the semiconductor substrate in a thickness direction of the semiconductor substrate. The heat dissipation member is arranged so as to interpose the semiconductor element in the thickness direction. The signal terminal is joined to a terminal portion of the signal wiring exposed from the insulator, and is electrically connected to the pad via the signal wiring.

In the semiconductor device according to the third aspect, the insulating portion is disposed above the scribe region. The insulating portion has the height that does not exceed the outer peripheral edge portion of the upper surface of the protective film. The redistribution layer is disposed over the protective film and the insulating portion. Therefore, the flatness of the redistribution layer can be improved as compared with the configuration in which the insulating portion is not arranged. In addition, since the flatness of the redistribution layer is improved, it is possible to suppress the signal wiring from being reduced in thickness or from being disconnected in the vicinity directly above the boundary between the element region and the scribe region. Further, it is possible to improve the electrical connection reliability between the pad and the signal terminal while simplifying the connection structure by eliminating a bonding wire.

According to a fourth aspect of the present disclosure, a semiconductor device includes an element package, a heat dissipation member, and a signal terminal. The element package includes a semiconductor element, a sealing resin body, and a redistribution layer. The semiconductor element has a semiconductor substrate, a main electrode, and a pad. The main electrode and the pad are disposed on a surface of the semiconductor substrate. The semiconductor substrate has an element region formed with an element and a scribe region disposed in a predetermined area from an end portion of the semiconductor substrate and surrounding the element region. The sealing resin body seals the semiconductor element, so that the main electrode and the pad are exposed from the sealing resin body. The redistribution layer is disposed adjacent to the surface of the semiconductor substrate with respect to the semiconductor element. The redistribution layer includes an insulator and a wiring disposed in the insulator. The insulator is in contact with the surface of the semiconductor substrate over the element region and the scribe region. The wiring includes a signal wiring connected to the pad. The signal wiring is disposed to extend over a boundary between the element region and the scribe region in a plan view of the semiconductor substrate in a thickness direction of the semiconductor substrate. The heat dissipation member is arranged so as to interpose the semiconductor element in the plate thickness direction. The signal terminal is joined to a terminal portion of the signal wiring exposed from the insulator and is electrically connected to the pad via the signal wiring.

In the semiconductor device according to the fourth aspect, the insulator of the redistribution layer is in contact with the surface of the semiconductor substrate over the element region and the scribe region. In other words, the semiconductor element does not have the protective film. Also in such a configuration, the flatness of the redistribution layer can be improved. In addition, since the flatness of the redistribution layer is improved, it is possible to suppress the signal wiring from being reduced in thickness or from being disconnected in the vicinity directly above the boundary between the element region and the scribe region. Further, it is possible to improve the electrical connection reliability between the pad and the signal terminal while simplifying the connection structure by eliminating a bonding wire.

Hereinafter, embodiments of the present disclosure will be described with reference to the drawings.

In the embodiments, parts that are functionally and/or structurally corresponding to and/or associated with each other will be given the same reference numerals. For the parts corresponding to and/or associated with each other, explanations thereof can be shared among the embodiments.

For example, a semiconductor device of an embodiment is applied to a power conversion device of a movable object having a rotary electric machine as a drive source. Examples of the movable object include an electrically powered vehicle such as an electric vehicle (EV), a hybrid vehicle (HV), or a fuel cell vehicle (FCV), a flying body such as a drone, a ship, a construction machine, and an agricultural machine. Hereinafter, examples in which the semiconductor device is applied to a vehicle as the movable object will be described.

First Embodiment

First, a schematic configuration of a drive system of a vehicle will be described with reference to FIG. 1.

<Vehicle Drive System>

As shown in FIG. 1, a vehicle drive system 1 is provided with a direct current (DC) power supply 2, a motor generator 3, and a power conversion device 4.

The DC power supply 2 is a direct-current voltage source including a chargeable/dischargeable secondary battery. The secondary battery is, for example, a lithium ion battery or a nickel hydride battery. The motor generator 3 is a three-phase AC type rotary electric machine. The motor generator 3 functions as a driving power source of a vehicle, that is, an electric motor. The motor generator 3 functions also as a generator during regeneration. The power conversion device 4 performs electric power conversion between the DC power supply 2 and the motor generator 3.

<Electric Power Converter>

Next, a circuit configuration of the power conversion device 4 will be described with reference to FIG. 1. The power conversion device 4 includes a power conversion circuit. The power conversion device 4 of the present embodiment includes a smoothing capacitor 5 and an inverter 6, which serves as the power conversion circuit.

The smoothing capacitor 5 mainly smoothens the DC voltage supplied from the DC power supply 2. The smoothing capacitor 5 is connected between a P line 7, which is a power line on a high potential side, and an N line 8, which is a power line on a low potential side. The P line 7 is connected to a positive electrode of the DC power supply 2, and the N line 8 is connected to a negative electrode of the DC power supply 2. A positive electrode of the smoothing capacitor 5 is connected to the P line 7 at a position between the DC power supply 2 and the inverter 6. A negative electrode of the smoothing capacitor 5 is connected to the N line 8 at a position between the DC power supply 2 and the inverter 6. The smoothing capacitor 5 is connected to the DC power supply 2 in parallel.

The inverter 6 serves as a DC-AC converter circuit. The inverter 6 converts the DC voltage into a three-phase AC voltage according to a switching control by a control circuit (not shown), and outputs the three-phase AC voltage to the motor generator 3. As such, the motor generator 3 is driven to generate a predetermined torque. At the time of regenerative braking of the vehicle, the inverter 6 converts the three-phase AC voltage generated by the motor generator 3 by receiving the rotational force from wheels into a DC voltage according to the switching control by the control circuit, and outputs the DC voltage to the P line 7. In this way, the inverter 6 performs bidirectional power conversion between the DC power supply 2 and the motor generator 3.

The inverter 6 includes higher and lower arm circuits 9 for three phases. The higher and lower arm circuit 9 is also referred to as a leg. The higher and lower arm circuit 9 includes a higher arm 9H and a lower arm 9L. The higher arm 9H and the lower arm 9L are connected in series between the P line 7 and the N line 8 so that the higher arm 9H is on the P line 7 side and the lower arm 9L is on the N line 8 side. A connection point between the higher arm 9U and the lower arm 9L is connected to a winding 3*a* of the corresponding phase in the motor generator 3 via an output line 10. The inverter 6 has six arms. Each arm is provided with a switching element. At least a part of each of the P line 7, the N line 8 and the output line 10 is formed of a conductive member such as a bus bar.

In the present embodiment, the switching element of each arm is provided by an n-channel metal oxide semiconductor field effect transistor (MOSFET) 11. The drain of the MOSFET 11 of the higher arm 9H is connected to the P line 7. The source of the MOSFET 11 of the lower arm 9L is connected to the N line 8. The source of the MOSFET 11 of the higher arm 9H and the drain of the MOSFET 11 of the lower arm 9L are connected to each other.

A freewheeling diode 12 is connected in anti-parallel to each of the MOSFETs 11. The diode 12 may be a parasitic diode (body diode) of the MOSFET 11 or may be provided separately from the parasitic diode. The anode of the diode 12 is connected to the source of the corresponding MOSFET 11. The cathode of the diode 12 is connected to the drain of the corresponding MOSFET 11.

The power conversion device 4 may further include a converter as the power conversion circuit. The converter is a DC-DC converter circuit for converting the DC voltage to a DC voltage with a different value. The converter is disposed between the DC power supply 2 and the smoothing capacitor 5. For example, the converter includes a reactor and the higher and lower arm circuit 9 as described above. In such a configuration, stepping up and stepping down are possible. The power conversion device 4 may further include a filter capacitor for removing power supply noise from the DC power supply 2. For example, the filter capacitor is provided between the DC power supply 2 and the converter.

The power conversion device 4 may include a drive circuit for the switching elements forming the inverter 6 and the like. The drive circuit supplies a drive voltage to a gate of the MOSFET 11 of the corresponding arm based on a drive command provided by the control circuit. The drive circuit drives the corresponding MOSFET 11 by applying the drive voltage to turn on and off the corresponding MOSFET 11. The drive circuit may also be referred to as a driver.

The power conversion device 4 may include a control circuit for the switching elements. The control circuit generates a drive command for operating the MOSFET 11 and outputs the drive command to the drive circuit. The control circuit generates the drive command based on a torque request input from a higher-level ECU (not shown) or signals detected by various sensors.

The various sensors include, for example, a current sensor, a rotation angle sensor, and a voltage sensor. The current sensor detects the phase current flowing through the winding 3*a* of each phase. The rotation angle sensor detects the rotation angle of the rotor of the motor generator 3. The voltage sensor detects the voltage across the smoothing capacitor 5. The control circuit outputs, for example, a PWM signal as the drive command. The control circuit includes, for example, a microcomputer. ECU is an abbreviation for an "electronic control unit". PWM is an abbreviation for a "pulse width modulation".

<Semiconductor Device>

Figure 2:
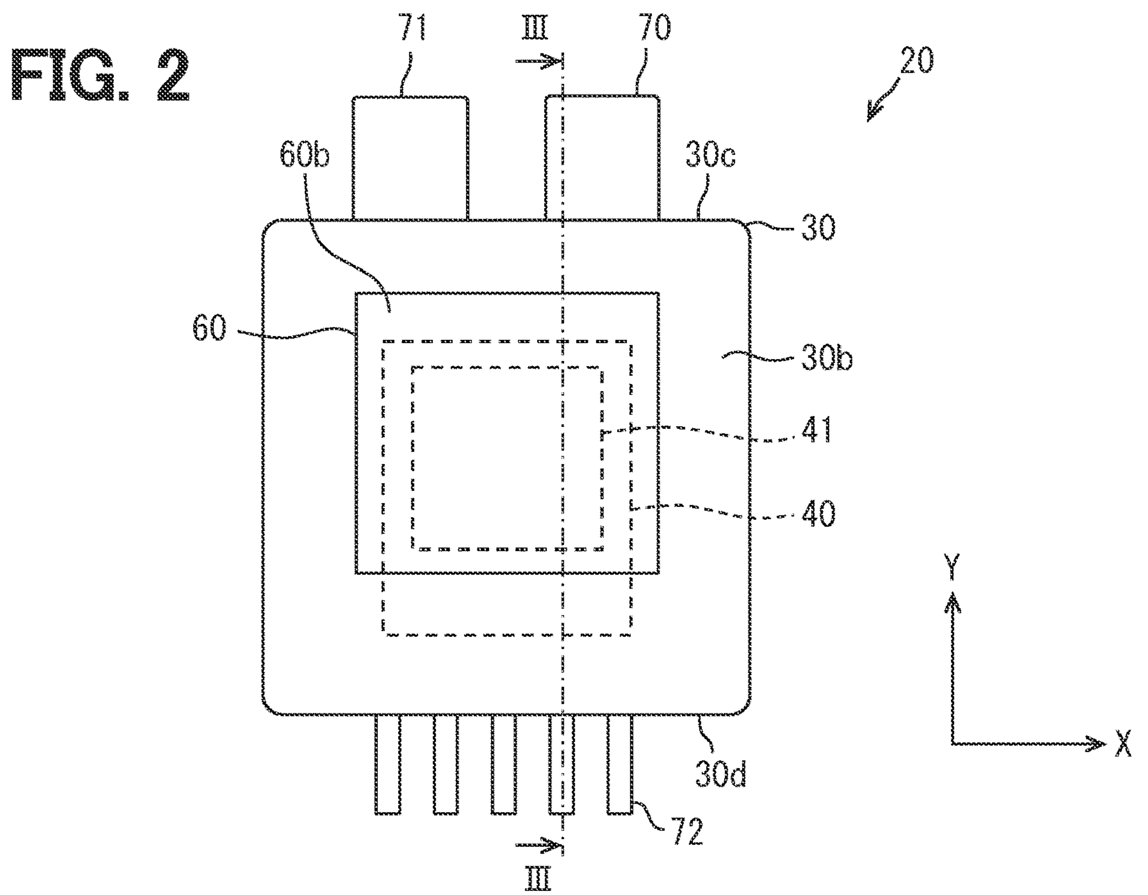
FIG. 2 is a diagram showing a plan view of the semiconductor device according to the first embodiment.
Figure 3:
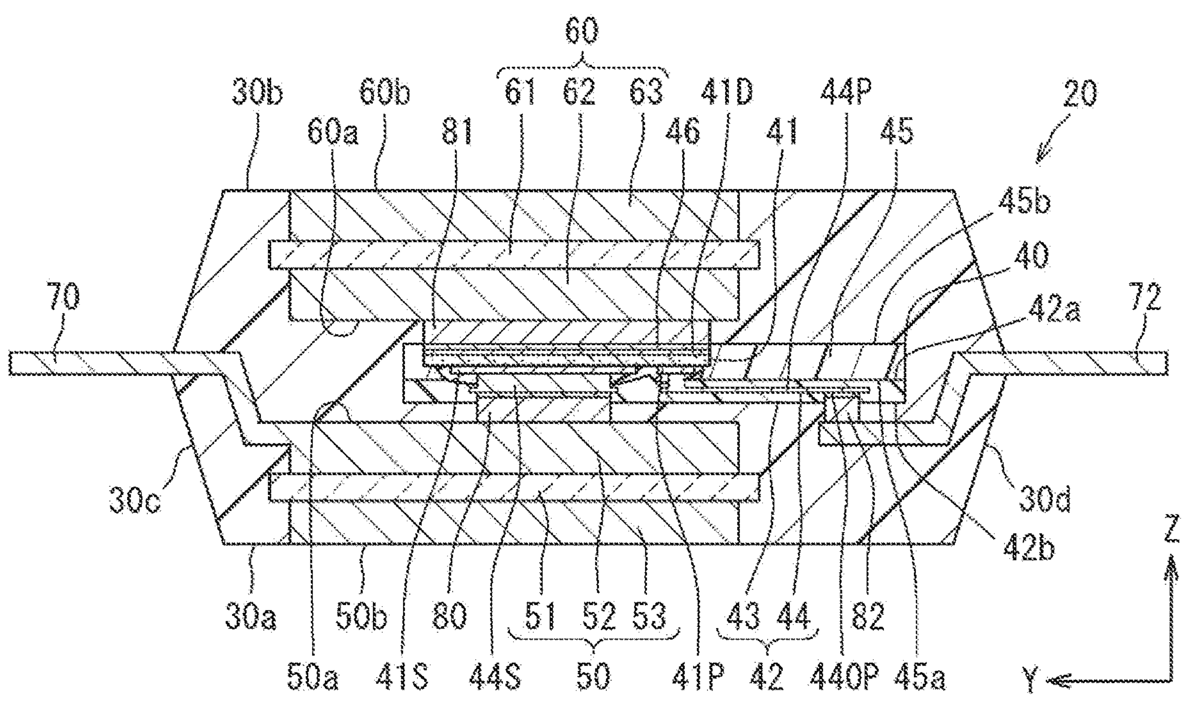
FIG. 3 is a diagram showing a cross-sectional view taken along a line III-III of FIG. 2.
Figure 4:
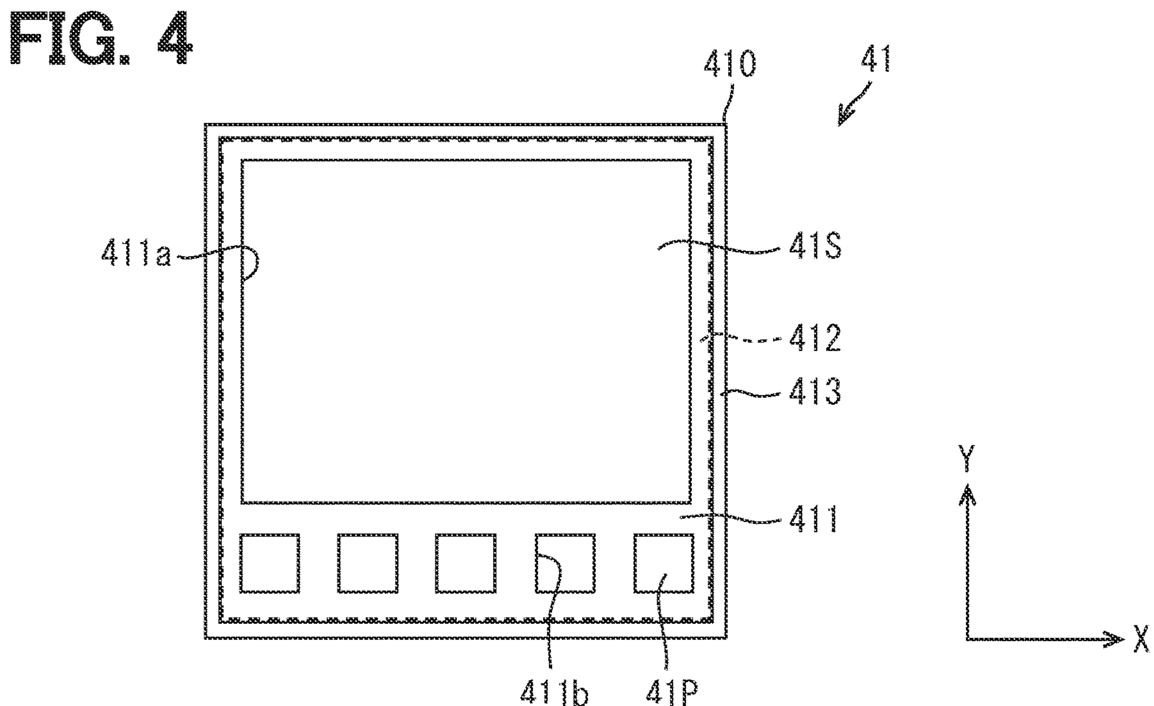
FIG. 4 is a diagram showing a plan view of a semiconductor element of the semiconductor device.

Next, a schematic configuration of the whole semiconductor device will be described with reference to FIG. 2, FIG. 3 and FIG. 4. FIG. 2 is a diagram showing a plan view of the semiconductor device. FIG. 2 is the diagram showing a top plan view of the semiconductor device. FIG. 3 is a diagram showing a cross-sectional view taken along a line III-III of FIG. 2. In FIG. 3, the configuration of an element package is illustrated in a simplified manner. FIG. 4 is a diagram showing, as a plan view, a schematic configuration of a semiconductor element included in the element package. In FIG. 4, a region surrounded by the dashed line corresponds to an element region.

Hereinafter, a thickness direction of the semiconductor element is defined as a Z direction. The Z direction also corresponds to a thickness direction of a semiconductor substrate. A direction orthogonal to the Z direction and along which an external connection terminal extends is defined as a Y direction. A direction orthogonal to both the Z direction and the Y direction is defined as an X direction. Unless otherwise specified, a shape viewed in a plane along the Z-direction, that is, a shape along an XY plane including the X-direction and Y-direction is referred to as a planar shape. A planar view viewed in the Z direction is simply referred to as a plan view.

A semiconductor device 20 shown in FIGS. 2 and 3 constitutes one of the arms described above. That is, two semiconductor devices 20 constitute the higher and lower arm circuit 9 for one phase. The semiconductor device 20 includes a sealing resin body 30, an element package 40, heat dissipation members 50 and 60, main terminals 70 and 71 as the external connection terminals, and signal terminals 72.

The sealing resin body 30 seals a part of other elements constituting the semiconductor device 20. The rest part of the other elements is exposed to the outside of the sealing resin body 30. The sealing resin body 30 is made of a resin material such as an epoxy resin. The sealing resin body 30 is formed by, for example, a transfer molding method. As shown in FIG. 2, the sealing resin body 30 has a generally rectangular shape in the plan view.

The element package 40 is a package including a switching element forming the arm and wirings connecting the switching element and other elements of the semiconductor device 20. As shown in FIGS. 2 to 4, the element package 40 includes a semiconductor element 41, a redistribution layer 42, and a sealing resin body 45.

The semiconductor element 41 is provided by a semiconductor substrate 410 on which the switching element is formed. For example, the semiconductor substrate 410 is made of silicon (Si), a wide bandgap semiconductor having a wider bandgap than silicon, or the like. Examples of the wide bandgap semiconductor include silicon carbide (SiC), gallium nitride (GaN), gallium oxide ($Ga_2O_3$) and diamond. The semiconductor element 41 is also called a power element or a semiconductor chip.

The semiconductor element 41 of the present embodiment is provided by forming the n-channel MOSFET 11 on the semiconductor substrate 410 made of SiC. The MOSFET 11 has a vertical structure that allows a main current to flow in the thickness direction of the semiconductor element 41 (the semiconductor substrate 410), that is, in the Z direction. The semiconductor element 41 has main electrodes on opposite plate surfaces of the semiconductor substrate 410. The semiconductor element 41 includes a gate electrode (not shown). The gate electrode has, for example, a trench structure.

The semiconductor element 41 has, as the main electrodes, a source electrode 41S formed on a first surface of the semiconductor substrate 410 and a drain electrode 41D formed on a second surface of the semiconductor substrate 410 opposite to the first surface. In a case where the diode 12 is a parasitic diode, the source electrode 41S serves also as an anode electrode, and the drain electrode 41D serves also as a cathode electrode. Alternatively, the diode 12 may be provided in a separate chip from the MOSFET 11.

The drain electrode 41D is formed in an almost entire area on the second surface of the semiconductor substrate 410. The source electrode 41S is formed at a part on the first surface of the semiconductor substrate 410. On the first surface of the semiconductor substrate 410, a pad 41P, which is a signal electrode, is formed in a region different from the part where the source electrode 41S is formed. The part where the source electrode 41S is formed will also be referred to as a formation region of the source electrode 41S. The pad 41P is electrically isolated from the source electrode 41S.

The pad 41P is formed near the end, which is on the side opposite to the formation region of the source electrode 41S in the Y direction. The pad 41P is provided side by side with the source electrode 41S in the Y direction. The pad 41P includes at least a pad for a gate electrode. In the present embodiment, the semiconductor element 41 has the five pads 41P. Specifically, the five pads 41P are for the gate electrode, for the Kelvin source that detects the potential of the source electrode 41S, for current sensing, for an anode potential of a temperature sensing diode (temperature sensing element) that detects the temperature of the semiconductor element 41, and for the cathode potential. The five pads 41P are collectively formed on one end side in the Y direction in the semiconductor element 41 having a generally rectangular planar shape, and are arranged side by side in the X direction.

The redistribution layer 42 is arranged adjacent to the first surface of the semiconductor element 41, that is, arranged on the source electrode 41S side of the semiconductor element 41. The redistribution layer 42 is in contact with, that is, closely contacts with the first surface of the semiconductor element 41. The redistribution layer 42 has a mounting surface 42*a* facing the semiconductor element 41, and a back surface 42*b* opposite to the mounting surface 42*a* in the Z direction. The semiconductor element 41 is arranged on the mounting surface 42*a* of the redistribution layer 42.

The redistribution layer 42 has an insulator 43 and a wiring 44 provided in the insulator 43. The insulator 43 is formed of a material including a resin material such as polyimide. The wiring 44 is formed of a highly conductive metal such as copper (Cu). The wiring 44 includes a source wiring 44S electrically connected to the source electrode 41S and a signal wiring 44P electrically connected to the pad 41P. A part of each of the source wiring 44S and the signal wiring 44P is exposed from the insulator 43 on the back surface 42*b* side of the redistribution layer 42. A portion of the signal wiring 44P exposed from the insulator 43 forms a terminal portion 440P for external connection. The redistribution layer 42 of the present embodiment has five signal wirings 44P corresponding to the pads 41P. That is, the redistribution layer 42 has five terminal portions 440P that are independent of each other.

The sealing resin body 45 seals at least a part of the mounting surface 42*a* of the redistribution layer 42 and the semiconductor element 41. The sealing resin body 45 is made of epoxy resin, for example. Although not shown, the epoxy resin contains a filler such as silica. The sealing resin body 45 is formed by a compression molding method, for example. The sealing resin body 45 is a primary molded body for sealing the semiconductor element 41, and the sealing resin body 30 is a secondary molded body for sealing the element package 40.

The sealing resin body 45 has a first surface 45*a* and a second surface 45*b* opposite to the first surface 45*a* in the Z direction. The first surface 45*a* of the sealing resin body 45 is on the same side as the first surface of the semiconductor substrate 410. The sealing resin body 45 forms a molded element together with the semiconductor element 41. The redistribution layer 42 is arranged on the molded element, that is, arranged over the semiconductor element 41 and the sealing resin body 45.

The drain electrode 41D of the present embodiment is covered with an electrode protective material 46 having conductivity. That is, the electrode protective material 46 is exposed on the second surface 45*b*. The drain electrode 41D of the semiconductor element 41 may be exposed on the second surface 45*b*. That is, the device package 40 may be configured not to have the electrode protective material 46. Details of the element package 40 will be described later.

The heat dissipation members 50 and 60 dissipate the heat generated by the semiconductor element 41 to the outside from both sides of the semiconductor device 20 in the Z direction. The heat dissipation members 50 and 60 are also called heat sinks. The heat dissipation members 50 and 60 are arranged so as to interpose a part of the element package 40 including the semiconductor element 41. The heat dissipation members 50 and 60 are arranged so as to face each other in the Z direction. The heat dissipation members 50 and 60 encompass the semiconductor element 41 and the source wiring 44S in the plan view. The heat dissipation members 50 and 60 encompass a part of the signal wiring 44P in the plan view. In the present embodiment, the signal wiring 44P is extended out from the pad 41P to an outer region that does not overlap the heat dissipation members 50 and 60 in the plan view. The terminal portion 440P is positioned outside the heat dissipation members 50 and 60 in the plan view. Instead of this configuration, the terminal portion 440P may be arranged in a region overlapping the heat dissipation members 50 and 60 in the plan view.

For example, the heat dissipation members 50 and 60 are provided by a metal plate made of Cu or a Cu alloy, a metal ceramic substrate such as a direct bonded copper (DBC) substrate or an active metal brazed (AMB) substrate, or a metal resin substrate in which a metal and a high thermal conductive resin are laminated similar to the metal ceramic substrate. The metal plate is also referred to as a lead frame. The heat dissipation members 50 and 60 may have a plated film of Ni, Au, or the like on the metal surface.

In the present embodiment, the heat dissipation members 50 and 60 are AMB substrates. The heat dissipation member 50 includes an insulating base material 51 and metal bodies 52 and 53. The insulating base material 51 is made of nitride ceramic. The metal bodies 52 and 53 are provided as Cu plates or Cu foils. The metal bodies 52 and 53 are joined to the insulating base material 51 with a brazing material containing active metal such as titanium (Ti).

The metal body 52 is provided on the surface of the insulating base material 51 adjacent to the element package 40. The metal body 53 is provided on the surface of the insulating base material 51 opposite to the metal body 52. The metal body 52 is joined to the source wiring 44S via the solder 80. The metal body 52 functions as a wiring for the source electrode 41S. For this reason, the heat dissipation member 50 is also referred to as a wiring member. The metal body 53 is electrically separated from the metal body 52 by the insulating base material 51. The heat generated by the semiconductor element 41 is transferred to the metal body 53 via solder 80, the metal body 52 and the insulating base material 51. The metal body 53 has a heat dissipation function.

The heat dissipation member 50 has substantially a rectangular shape in the plan view. The heat dissipation member 50 has a facing surface 50*a*, which faces the element package 40, and a back surface 50*b*, which is opposite to the facing surface 50*a*. The facing surface 50*a* is provided by a surface of the metal body 52 on an opposite side to the insulating base material 51, and the back surface 50*b* is provided by a surface of the metal body 53 on an opposite side to the insulating base material 51. In the present embodiment, the back surface 50*b* of the heat dissipation member 50 is exposed on a first surface 30*a* of the sealing resin body 30. The back surface 50*b* may also be referred to as a heat dissipation surface or an exposed surface. The first surface 30*a* of the sealing resin body 30 is on the first surface side of the semiconductor element 41 in the Z direction. That is, the first surface 30*a* of the sealing resin body 30 is the surface on the same side as the source electrode 41S with respect to the semiconductor element 41. The first surface 30*a* is, for example, a flat surface. The back surface 50*b* is substantially coplanar with the first surface 30*a* of the sealing resin body 30.

The heat dissipation member 60 has similar configurations to those of the heat dissipation member 50. The heat dissipation member 60 includes an insulating base material 61 and metal bodies 62 and 63. The metal body 62 is provided on the surface of the insulating base material 61 adjacent to the element package 40. The metal body 62 is joined to the electrode protective material 46 via solder 81. The metal body 62 functions as a wiring for the drain electrode 41D. For this reason, the heat dissipation member 60 is also referred to as a wiring member. The metal body 63 is provided on the surface of the insulating base material 61 opposite to the metal body 62. The metal body 63 is electrically separated from the metal body 62 by the insulating base material 61. The heat generated by the semiconductor element 41 is transferred to the metal body 63 via solder 81, the metal body 62 and the insulating base material 61. The metal body 63 has a heat dissipation function.

The heat dissipation member 60 has substantially a rectangular shape in the plan view. The heat dissipation member 60 has a facing surface 60*a*, which faces the element package 40, and a back surface 60*b*, which is opposite to the facing surface 60*a*. The facing surface 60*a* is provided by a surface of the metal body 62 on an opposite side to the insulating base material 61, and the back surface 60*b* is provided by a surface of the metal body 63 on an opposite side to the insulating base material 61. In the present embodiment, the back surface 60*b* of the heat dissipation member 60 is exposed from the second surface 30*b* of the sealing resin body 30. The back surface 60*b* may also be referred to as a heat dissipation surface or an exposed surface. The second surface 30*b* of the sealing resin body 30 is on the second surface side of the semiconductor element 41 in the Z direction. That is, the second surface 30*b* of the sealing resin body 30 is the surface on the same side as the drain electrode 41S with respect to the semiconductor element 41. The second surface 30*b* is opposite to the first surface 30*a* in the Z direction. The second surface 30*b* is, for example, a flat surface. The back surface 60*b* is substantially coplanar with the second surface 30*b* of the sealing resin body 30.

The main terminals 70 and 71 and the signal terminals 72 are external connection terminals for electrically connecting the semiconductor device 20 to an external device. The main terminals 70 and 71 are electrically connected to the main electrodes. The main terminal 70 is electrically connected to the source electrode 41S. The main terminal 70 is also referred to as a source terminal. The main terminal 71 is electrically connected to the drain electrode 41D. The main terminal 71 is also referred to as a drain terminal.

The main terminal 70 is connected to the source electrode 41S through the heat dissipation member 50. The main terminal 70 is connected to one end of the metal body 52 of the heat dissipation member 50 in the Y direction. The thickness of the main terminal 70 is smaller than that of the metal body 52, for example. The main terminal 70 may be connected to the heat dissipation member 50 as being integrally formed with the metal body 52. Alternatively, the main terminal 70 may be provided as a separate member from the metal body 52, and be connected to the metal body 52. The main terminal 70 extends in the Y direction from the heat dissipation member 50 and protrudes from a side surface 30*c* of the sealing resin body 30 to the outside. The main terminal 70 has a bent portion in the part covered with the sealing resin body 30, and protrudes from the vicinity of the center in the Z direction on the side surface 30*c*.

The main terminal 71 is connected to the drain electrode 41D via the heat dissipation member 60. The main terminal 71 is connected to one end of the metal body 62 of the heat dissipation member 60 in the Y direction. The thickness of the main terminal 71 is smaller than that of the metal body 62, for example. The main terminal 71 may be connected to the heat dissipation member 60 as being integrally formed with the metal body 62. Alternatively, the main terminal 71 may be provided as a separate member from the metal body 62, and be connected to the metal body 62. The main terminal 71 extends from the heat dissipation member 60 in the Y direction and protrudes outside from the same side surface 30*c* as the main terminal 70. The main terminal 71 has a bent portion in the part covered with the sealing resin body 30, and protrudes from the vicinity of the center in the Z direction on the side surface 30*c*. The two main terminals 70 and 71 are arranged side by side in the X direction.

The signal terminal 72 is electrically connected to the pad 41P of the semiconductor element 41. The signal terminal 72 of the present embodiment is connected to the terminal portion 440P of the redistribution layer 42 via solder 82. That is, the signal terminal 72 is electrically connected to the pad 41P via the solder 82 and the signal wiring 44P including the terminal portion 440P. The signal terminal 72 is extended in the Y direction and protrudes to the outside from a side surface 30*d* of the sealing resin body 30. The side surface 30*d* is a surface opposite to the side surface 30*c* in the Y direction. The semiconductor device 20 of the present embodiment includes five signal terminals 72 corresponding to the pads 41P. The signal terminal 72 is connected to the corresponding pad 41P via the signal wiring 44P. The solders 80, 81, 82 are multicomponent lead-free solders containing, for example, Cu, Ni, or the like in addition to Sn. Instead of the solders 80, 81 and 82, a bonding material having conductivity other than solder, such as sintered silver, may be used.

As described above, in the semiconductor device 20, the semiconductor element 41 forming one arm is sealed with the sealing resin body 30. The sealing resin body 30 integrally seals the element package 40 including the semiconductor element 41, a part of the heat dissipation member 50, a part of the heat dissipation member 60, a part of each of the main terminals 70 and 71, and a part of each of the signal terminals 72.

The semiconductor element 41 is arranged between the heat dissipation members 50 and 60 in the Z direction. The semiconductor element 41 is interposed between heat dissipation members 50 and 60 arranged to face each other. Thus, the heat of the semiconductor element 41 can be dissipated on both sides in the Z direction. The semiconductor device 20 has a double-sided heat dissipation structure. The back surface 50*b* of the heat dissipation member 50 is substantially coplanar with the first surface 30*a* of the sealing resin body 30. The back surface 60*b* of the heat dissipation member 60 is substantially coplanar with the second surface 30*b* of the sealing resin body 30. Since the back surfaces 50*b* and 60*b* are exposed surfaces, it is possible to enhance the heat dissipation.

In the semiconductor device 20, the semiconductor element 41 is packaged together with the redistribution layer 42. The redistribution layer 42 has the signal wirings 44P that electrically connects the pad 41P of the semiconductor element 41 and the signal terminal 72. The signal terminal 72 is soldered to the terminal portion 440P of the signal wiring 44P. Therefore, it is possible to eliminate bonding wires. Moreover, it is not necessary to dispose a terminal block, such as a metal block, between the semiconductor element 41 and the heat dissipation member 50 in order to ensure the height of the bonding wires. Therefore, the size of the semiconductor device 20 can be reduced in the Z direction. Also, the structure and manufacturing process can be simplified.

<Element Package>

Next, a configuration of the element package 40 will be described in detail with reference to FIGS. 4, 5, 6 and 7. FIG. 5 is a plan view showing the element package. In FIG. 5, the redistribution layer 42 is indicated by a chain double-dashed line for convenience. FIG. 6 is a cross-sectional view taken along a line VI-VI in FIG. 5. FIG. 7 is an enlarged view of a part VII indicated by a dashed line in FIG. 6. In FIG. 7, the structure of the element package 40 is illustrated in a simplified manner, such as by omitting illustration of the electrodes.

As shown in FIGS. 4 to 6, the semiconductor element 41 has a protective film 411. The protective film 411 is an electrically insulating film provided on a first surface 410*a* of the semiconductor substrate 410 so as to cover the periphery of the electrode. The protective film 411 is not provided on a second surface 410*b* of the semiconductor substrate 410. The protective film 411 is also referred to as an element insulating film.

The protective film 411 has an opening 411*a* formed at a position corresponding to the source electrode 41S in the plan view. The protective film 411 has an opening 411*b* formed at a position corresponding to the pad 41P in the plan view. The opening 411*b* is provided for each pad 41P. The source electrode 41S and the pads 41P are exposed to the outside through corresponding openings 411*a* and 411*b*.

Each of the openings 411*a* and 411*b* is a through hole penetrating the protective film 411 in the Z direction. The protective film 411 covers the peripheral edge portion of the source electrode 41S and the peripheral edge portions of the pads 41P. In the present embodiment, the protective film 411 is made of polyimide.

A semiconductor substrate 410 has an element region 412 and a scribe region 413. The element region 412 includes an active region, which is an element formation region, and a peripheral voltage withstand region. The active region is also referred to as a main region. In the active region, a part of the MOSFET 11 including components on the first surface side, such as a trench gate, a base region, a source region, and the like is formed. The peripheral voltage withstand region is a region outside the element region 412, and surrounds the element region 412 in the plan view. In the peripheral voltage withstand region, a voltage withstand structure such as a guard ring 414 is formed on the surface layer of the semiconductor substrate 410 on the first surface 410*a* side. The source electrode 41S and the pad 41P are formed on the element region 412.

The scribe region 413 is a region provided in a predetermined area from the outer end of the semiconductor substrate 410 in the plan view. The scribe region 413 surrounds the element region 412 in the plan view. The scribe region 413 is a dicing area used for dividing or dicing the semiconductor substrate in the wafer state into chips. By dicing the wafer-shaped semiconductor substrate along the scribe region 413, a chip-shaped semiconductor substrate 410 is obtained. In the present embodiment, the protective film 411 is arranged only above the element region 412. The protective film 411 is not arranged above the scribe region 413.

The redistribution layer 42 is arranged so as to overlap the molded element, that is, the semiconductor element 41 and the sealing resin body 45 in the plan view. The insulator 43 of the redistribution layer 42 is composed of first and second insulating films 431 and 432 arranged in multiple layers. The first insulating film 431 is laid on a surface of the semiconductor element 41 and on the second surface 45*a* of the sealing resin body 45. The second insulating film 432 is laid on the insulating film 431. The first and second insulating films 431 and 432 of the present embodiment are formed using the same material as the protective film 411, specifically, polyimide.

The first insulating film 431 in a first layer has openings 431*a* and 431*b*. The opening 431*a* is formed at a position corresponding to the source electrode 41S in the plan view. The opening 431*a* overlaps at least part of the opening 411*a* in the plan view. The opening 431*b* is formed at a position corresponding to the pad 41P in the plan view. The opening 431*b* overlaps at least part of the opening 411*b* in the plan view. The opening 431*b* is provided for each pad 41P.

The second insulating film 432 in a second layer has openings 432*a* and 432*b*. The opening 432*a* is formed at a position corresponding to the source electrode 41S in the plan view. The opening 432*b* is formed at a position corresponding to the terminal portion 440P of the signal wiring 44P.

The wiring 44 can be formed by, for example, a plating method, a dispensing method, or a printing method. The wiring 44 of the present embodiment is formed by a plating method. The source wiring 44S is formed directly above the source electrode 41S. The source wiring 44S is stacked at least on the exposed portion of the source electrode 41S. The source wiring 44S includes, as a first-layer wiring, a wiring arranged in a first layer on the first insulating film 431 so as to cover the exposed portion of the source electrode 41S in the opening 431*a*. A peripheral end portion of the first-layer wiring is covered with the second insulating film 432. The source wiring 44S may include another wiring in a second layer, as a second-layer wiring. The second-layer wiring of the source wiring 44S is stacked on the first-layer wiring in the opening 432*a*.

The signal wiring 44P is stacked on the exposed portion of the pad 41P. The signal wiring 44P includes, as a first-layer wiring, a wiring arranged in a first layer on the first insulating film 431 so as to cover the exposed portion of the pad 41P in the opening 431*b*. A part of the first-layer wiring of the signal wiring 44P is exposed through the opening 432*b*, and a remaining part is covered with the insulating film 432. The exposed portion of the first-layer wiring of the signal wiring 44P forms the terminal portion 440P of the signal wiring 44P. The first-layer wiring of the signal wiring 44P extends from the corresponding pad 41P to the corresponding terminal portion 440P over a boundary between the element region 412 and the scribe region 413 in the Y direction.

The signal wiring 44P may include another wiring in a second layer, as a second-layer wiring. The second-layer wiring of the signal wiring 44P is stacked on the first-layer wiring in the opening 432*b*. The second-layer wiring constitutes the terminal portion 440P together with the first-layer wiring. In the wiring 44 of the present embodiment, the first-layer wiring is a plated film made of Cu. The second-layer wiring is a plated film made of a metal, such as Ni, which improves the bondability with solder.

The sealing resin body 45 seals the semiconductor element 41 as described above. The sealing resin body 45 covers the side surface 410*c* of the semiconductor substrate 410. The sealing resin body 45 is in contact with, that is, closely contacts with the side surface 410*c*. The side surface 410*c* is a surface substantially parallel to the Z direction and connecting the first surface 410*a* and the second surface 410*b*. The sealing resin body 45 of the present embodiment entirely covers the side surface 410*c*.

The sealing resin body 45 also covers a part of the first surface 410*a* defining the scribe region 413 of the semiconductor substrate 410. That is, the sealing resin body 45 covers the scribe region 413 at the first surface 410*a* of the semiconductor substrate 410. The sealing resin body 45 is stacked on the first surface 410*a* in the scribe region 413. The sealing resin body 45 is in contact with, that is, closely contacts with the scribe region 413. Hereinafter, a part of the sealing resin body 45 arranged on the first surface 410*a* of the semiconductor substrate 410 in the plan view, that is, positioned on the scribe region 413 is referred to as a sealing resin body 45S. As shown in FIGS. 6 and 7, the sealing resin body 45S is in contact with a side surface 411*c* defining the outer peripheral edge of the protective film 411. A lower end of the side surface 411*c* defines the boundary between the element region 412 and the scribe region 413.

The sealing resin body 45S entirely covers the side surface 411*c*. The sealing resin body 45S is in contact with, that is, closely contacts with the side surface 411*c*. The first surface 45*a* of the sealing resin body 45S is substantially flush with at least an outer peripheral edge portion 411*d* of an upper surface of the protective film 411 arranged on the element region 412. The upper surface of the protective film 411 is the surface opposite to the semiconductor element 41. The edge portion 411*d* of the upper surface is a portion located in a predetermined range from the outer peripheral end of the protective film 411 arranged on the element region 412. The edge portion 411*d* continues to the side surface 411*c*. The edge portion 411*d* corresponds to the outer peripheral edge portion. The first surface 45*a* of the sealing resin body 45 corresponds to the upper surface of the sealing resin body.

The sealing resin body 45 does not cover the upper surface of the protective film 411 including the edge portion 411*d*. The insulator 43 of the redistribution layer 42 is in close contact with the upper surface of the protective film 411 including the edge portion 411*d* and the first surface 45*a* of the sealing resin body 45 including the sealing resin body 45S.

<Method for Manufacturing Element Package>

Figure 8:
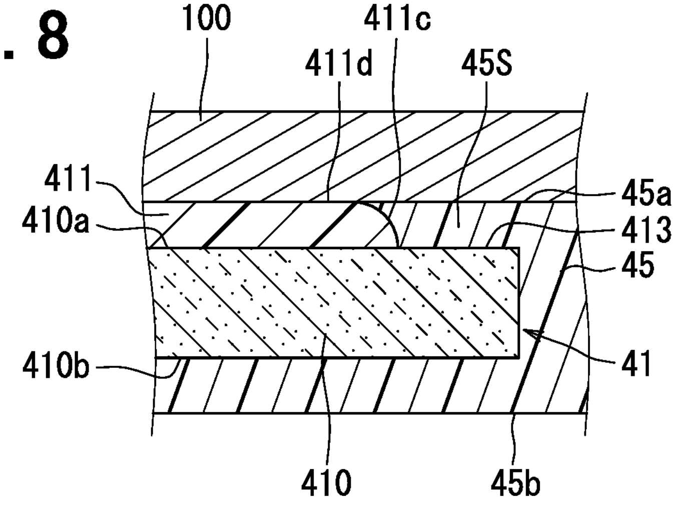
FIG. 8 is a diagram showing a cross-sectional view for explaining a method for manufacturing the element package.

Next, an example of a method for manufacturing the element package 40 described above will be described. FIG. 8 is a cross-sectional view showing the manufacturing method. FIG. 8 corresponds to FIG. 7 and illustrates the semiconductor element 41 in a simplified manner.

First, the semiconductor element 41 and a support substrate 100 shown in FIG. 8 are prepared. The support substrate 100 has an adhesive layer (not shown) on a first surface side. The semiconductor element 41 is attached to the first surface side of the support substrate 100 so that the source electrode 41S faces the support substrate 100. The support substrate 100 has a wafer shape, and multiple semiconductor elements 41 are attached to a single support substrate 100. The semiconductor element 41 is attached so that the upper surface of the protective film 411 including the edge portion 411*d* is in close contact with the support substrate 100, and the side surface 411*c* and the scribe region 413 of the first surface 410*a* form a gap with the support substrate 100. Also, an electrode protective material 46 is attached onto the drain electrode 41D of the semiconductor element 41. In FIG. 8, the electrode protective material 46 is not shown.

Next, the sealing resin body 45 is molded. The multiple semiconductor elements 41 are sealed together with the first surface of the support substrate 100 by a compression molding, for example. In this manner, the sealing resin body 45 is formed collectively for the multiple semiconductor elements 41. As shown in FIG. 8, the resin enters the gap defined by the support substrate 100, the side surface 411*c* of the protective film 411, and the first surface 410*a* defining the scribe region 413 of the semiconductor element 41. The gap is filled with the resin. The sealing resin body 45 also covers the second surface 410*b* side of the semiconductor substrate 410, that is, covers the electrode protective material 46. After molding, the support substrate 100 is peeled off. In this way, a molded wafer is produced.

Next, the redistribution layer 42 is formed. The redistribution layer 42 is formed on the mold wafer. That is, the redistribution layer 42 is formed collectively for the multiple semiconductor elements 41. First, the first insulating film 431 is formed so as to cover the first surface 410*a* side of the semiconductor element 41 and the first surface 45*a* of the sealing resin body 45. Also, the openings 431*a* and 431*b* are formed by patterning. After patterning the first insulating film 431, the first layer of the wiring 44 is formed by plating. Next, the second insulating film 432 is formed and patterned to form the openings 432*a* and 432*b*. After patterning the second insulating film 432, the second layer of the wiring 44 is formed by plating, if necessary. In this way, the wafer-shaped redistribution layer 42 having the wirings 44 corresponding to the respective semiconductor elements 41 is formed.

Then, the sealing resin body 45 is thinned. The sealing resin body 45 is ground from the second surface 45*b* side, and the electrode protective material 46 is cut halfway. As a result, the electrode protective material 46 is exposed from the second surface 45*b*.

Next, the sealing resin body 45 and redistribution layer 42, which are collectively formed into the wafer-shape, are diced. As a result, the sealing resin body 45 and the redistribution layer 42 are divided for the respective semiconductor elements 41. In this way, the element package 40 can be produced.

Summary of First Embodiment

Figure 9:
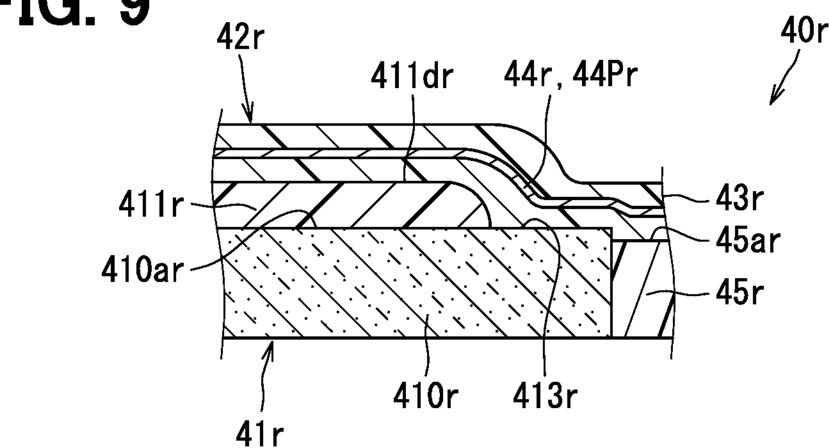
FIG. 9 is a diagram showing a cross-sectional view of an element package of a reference example.
Figure 9:
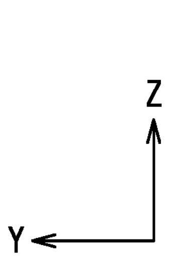

FIG. 9 is a cross-sectional view showing a reference example. In the reference example, the elements identical or related to the present embodiment are denoted by adding "r" to the tails of the reference numerals in the present embodiment. FIG. 9 shows a part corresponding to the part shown in FIG. 7.

In the reference example, a protective film 411*r* is not provided above a scribe region 413*r*. Also, the sealing resin body 45*r* is not arranged on a first surface 410*ar* of a semiconductor substrate 410*r*. The molded element has a stepped structure portion between an edge portion 411*dr* of the upper surface of the protective film 411*r* and the first surface 410*ar* defining the scribe region 413*r* of the semiconductor substrate 410*r*.

The redistribution layer 42*r* is formed on the semiconductor element 41*r* and the sealing resin body 45. The thickness of a wiring 44*r*, such as a signal wiring 44Pr, and/or an insulator 43*r* is less even on the stepped structure portion of the molded element than that on the flat structure portion. On the stepped structure portion, for example, the thickness of the wiring 44*r* is thin, and there is a possibility that disconnection may occur. In addition, the thickness of the insulator 43*r* is thin, and there is a possibility that the insulating property, such as voltage resistance, of the insulator 43*r* is lowered.

In particular, in the case of the semiconductor element 41*r* used for the power conversion circuit, the thickness of the protective film 411*r* is ten and several micrometers. As a result, the step is large, and the redistribution layer 42*r* is likely to have defects due to the large step. In applications other than power elements, the thickness of the protective film is several micrometers.

In addition, in a case where a support substrate in which the semiconductor substrate 410*r* and the sealing resin body 45*r* are substantially flush with each other is used, the semiconductor element 41*r* sinks with respect to the support substrate when the semiconductor substrate 410*r* is attached. As a result, there is a possibility that the stepped structure portion may occur between the end of the first surface 410*ar* of the semiconductor substrate 410*r* and the first surface 45*ar* of the sealing resin body 45*r*. In such a case, the step is smaller than the step on the protective film 411*r* side and is about several micrometers. There is a possibility that the redistribution layer 42 may have defects in the vicinity directly above the stepped structure portion.

In the present embodiment, the sealing resin body 45S is provided above the scribe region 413 on the first surface 410*a* of the semiconductor substrate 410, as described above. The sealing resin body 45S has a height above the scribe region 413 that does not exceed the edge portion 411*d* of the upper surface of the protective film 411. Above the scribe region 413, the sealing resin body 45S does not protrude higher than the edge portion 411*d*. The distance between the first surface 45*a* of the sealing resin body 45S and the first surface 410*a* of the semiconductor substrate 410 is equal to or less than the distance between the edge portion 411$d$ of the protective film 411 and the first surface 410$a$. The sealing resin body 45S substantially fills the step between the edge portion 411$d$ and the first surface 410$a$ on the scribe region 413.

The redistribution layer 42 is arranged above the upper surface of the protective film 411 including the edge portion 411$d$ and the first surface 45$a$ of the sealing resin body 45 including the sealing resin body 45S. As shown in FIG. 7, the redistribution layer 42 is arranged over the protective film 411 and the sealing resin body 45S so as to extend over the boundary between the element region 412 and the scribe region 413. In FIG. 7, the boundary is indicated by a dashed-dotted line. Therefore, the flatness of the redistribution layer 42 can be improved as compared with the configuration in which the sealing resin body 45S is not arranged on the scribe region 413, that is, the configuration shown in the reference example. Specifically, the flatness of the redistribution layer 42 can be improved in the vicinity directly above the boundary between the element region 412 and the scribe region 413.

In addition, since the sealing resin body 45S covers the scribe region 413, a stepped structure portion is not formed between the sealing resin body 45 and the end portion of the first surface 410$a$ of the semiconductor substrate 410. Therefore, the flatness of the redistribution layer 42 can be improved in the vicinity directly above the end portion of the first surface 410$a$ of the semiconductor substrate 410.

In the present embodiment, the sealing resin body 45S constitutes an insulating portion stacked on the scribe region 413. The sealing resin body 45S is in contact with the side surface 411$c$ of the protective film 411. Since there is no need to provide a separate member from the sealing resin body 45, the configuration of the element package 40 can be simplified. Also, the manufacturing process can be simplified.

In the present embodiment, the first surface 45$a$ of the sealing resin body 45S connects to the edge portion 411$d$ of the upper surface of the protective film 411 so as to be substantially flush. The first surface 45$a$ of the sealing resin body 45S and the edge portion 411$d$ of the protective film 411 form a continuous flat shape. The height in the Z direction with respect to the first surface 410$a$ is substantially equal between the first surface 45$a$ of the sealing resin body 45S and the edge portion 411$d$. With such a substantially flush configuration, the redistribution layer 42 is substantially flat in the vicinity directly above the boundary between the element region 412 and the scribe region 413. That is, flatness can be further improved.

In the present embodiment, the signal wiring 44P connected to the pad 41P of the semiconductor element 41 extends over the boundary between the element region 412 and the scribe region 413 in the plan view. However, since the sealing resin body 45S is arranged above the scribe region 413, it is less likely that the thickness of the signal wiring 44P will be reduced or the signal wiring 44P will be disconnected in the vicinity directly above the boundary. Therefore, the electrical connection reliability between the pad 41P and the signal terminal 72 can be improved while simplifying the connection structure by eliminating the bonding wire. By eliminating the bonding wires, wire sweep and disconnection do not occur during molding of the sealing resin body 30.

In the present embodiment, the semiconductor element 41 is formed with the MOSFET 11, which is a power switching element. The semiconductor element 41 constitutes the inverter 6, which is a power conversion circuit. Therefore, the thickness of the protective film 411 is as thick as ten and several micrometers. However, since the sealing resin body 45S is arranged above the scribe region 413, the flatness of the redistribution layer 42 can be improved even though there is a large step between the edge portion 411$d$ and the first surface 410$a$.

Modification

Figure 10:
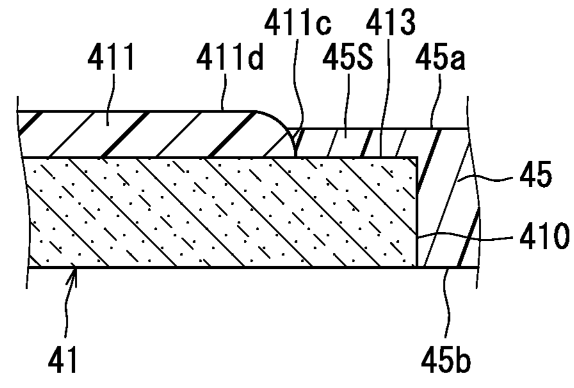
FIG. 10 is a diagram showing a cross-sectional view of an element package according to a modification.
Figure 10:
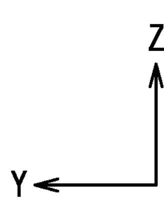

The example in which the first surface 45$a$ of the sealing resin body 45S arranged above the scribe region 413 connects to the edge portion 411$d$ of the upper surface of the protective film 411 in a substantially flush manner has been described above. However, the present disclosure is not limited to the example described above. For example, as shown in FIG. 10, the sealing resin body 45S may be provided such that the first surface 45$a$ is positioned lower than the edge portion 411$d$. In FIG. 10, the redistribution layer 42 is not shown for the sake of convenience.

The distance between the first surface 45$a$ of the sealing resin body 45S and the first surface 410$a$ of the semiconductor element 41 is smaller than the distance of the edge portion 411$d$ and the first surface 410$a$. The sealing resin body 45S contacts only the lower end portion of the side surface 411$c$ in the Z direction, and does not contact the upper end portion of the side surface 411$c$. Even with such a configuration, the flatness of the redistribution layer 42 can be improved as compared with a configuration in which the sealing resin body 45S is not arranged above the scribe region 413. Specifically, the flatness of the redistribution layer 42 can be improved in the vicinity directly above the boundary between the element region 412 and the scribe region 413.

Second Embodiment

A second embodiment is a modification of the preceding embodiment as a basic configuration and may incorporate description of the preceding embodiment. In the preceding embodiment, no particular reference is made to the size of the filler contained in the sealing resin body. Alternatively, the size of the filler may be specified.

Figure 11:
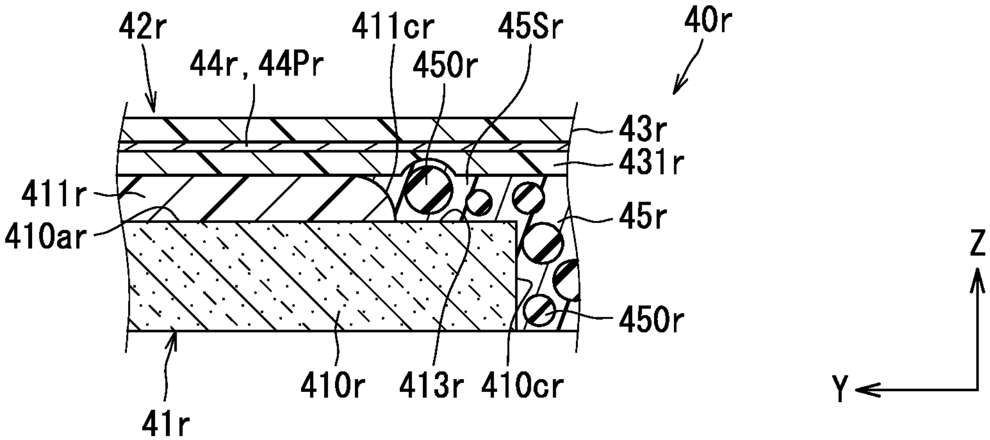
FIG. 11 is a diagram showing a cross-sectional view of an element package of a reference example.

FIG. 11 is a cross-sectional view showing a reference example of an element package. FIG. 11 shows a part corresponding to the part shown in FIG. 7. In the configuration in which the sealing resin body 45$r$ is arranged above the scribe region 413$r$, there is a possibility that the filler will be arranged above the scribe region 413$r$ when molding the sealing resin body 45$r$. In this case, since the redistribution layer 42 is formed on the filler 450$r$ as shown in FIG. 11, the flatness of the wiring 44$r$, that is, the insulator 43$r$ and/or the signal wiring 44Pr is lowered in the vicinity directly above the filler 450$r$.

If the thickness of the insulator 43$r$, for example, the insulating film 431$r$ is small, the insulating distance from the wiring 44$r$ to an outer surface of the redistribution layer 42$r$ is reduced. As a result, there is a possibility that a decrease in voltage resistance or a short circuit may occur. Since the thickness of the portion interposed between the filler 450$r$ and the redistribution layer 42$r$ in the sealing resin body 45Sr is small, cracks are likely to occur. Since the insulator 43$r$ (insulating film 431$r$) directly above the filler 450$r$ is also thin, there is a fear that the crack will propagate toward the insulator 43$r$.

If the thickness of the sealing resin body 45$r$ directly under the filler 450$r$ is small, peeling or separation of the sealing resin body 45$r$ from the semiconductor element 41$r$ tends to progress. Specifically, the separation is likely to progress from the side surface 410*cr* side toward the side surface 411*c* side of the protective film 411*r* via the thin first surface 410*ar*.

Figure 12:
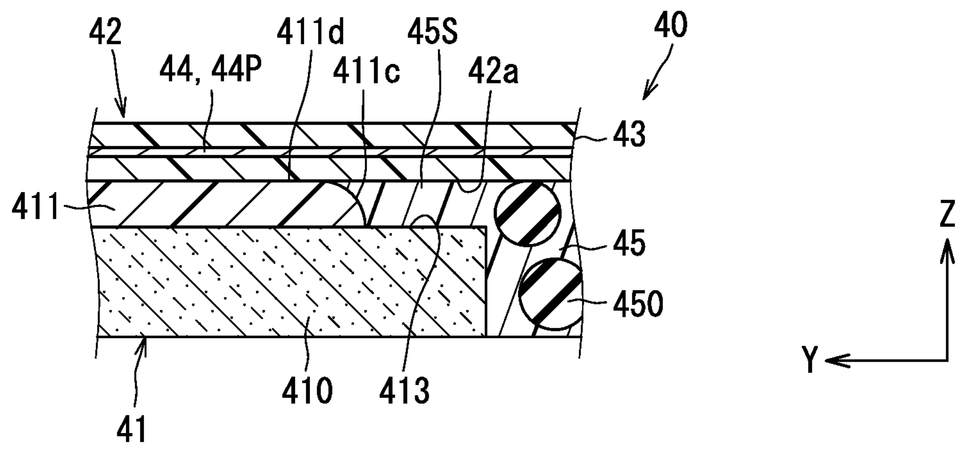
FIG. 12 is a diagram showing a cross-sectional view of an element package of a semiconductor device according to a second embodiment.

In the present embodiment, as shown in FIG. 12, the particle size, such as diameter, of the filler 450 contained in the sealing resin body 45 is larger than the dimension of the step between the edge portion 411*d* of the upper surface of the protective film 411 and the first surface 410*a* of the semiconductor substrate 410 on the scribe region 413. Filler cut is employed so that only the filler 450 with a particle size larger than the step is used. As a result, the filler 450 does not enter the opposing region between the scribe region 413 and the redistribution layer 42. The sealing resin body 45S on the scribe region 413 does not contain the filler 450, and the sealing resin body 45 excluding the sealing resin body 45S contains the filler 450. Other configurations are similar to those of the preceding embodiment.

Summary of Second Embodiment

As described above, in the present embodiment, only the filler 450 having a particle size larger than the step between the edge portion 411*d* of the upper surface of the protective film 411 and the scribe region 413 on the first surface 410*a* of the semiconductor substrate 410 is used. Therefore, when molding the sealing resin body 45 as shown in FIG. 8 of the preceding embodiment, it is possible to restrict the filler 450 from entering the opposing region between the support substrate 100 and the scribe region 413 of the semiconductor substrate 410. Accordingly, it is possible to restrict the filler 450 from being included in the sealing resin body 45S on the scribe region 413. Therefore, the flatness of the redistribution layer 42 can be improved while covering the scribe region 413 with the sealing resin body 45S.

Preferably, a filler 450 having a particle size that is twice or more the size of the step is used. Therefore, it is possible to more effectively suppress the filler 450 from being introduced in the opposing region between the scribe region 413 and the redistribution layer 42.

The configuration of the present embodiment can also be combined with the modification described in the preceding embodiment shown in FIG. 10. In the configuration in which the sealing resin body 45S above the scribe region 413 is lower than the edge portion 411*d*, it is possible to suppress the filler 450 from being included in the sealing resin body 45S.

Third Embodiment

A third embodiment is a modification of the preceding embodiments as a basic configuration and may incorporate descriptions of the preceding embodiments. In the preceding embodiments, the sealing resin body is arranged above the scribe region 413. Alternatively, a protective film may be arranged above the scribe region 413.

Figure 13:
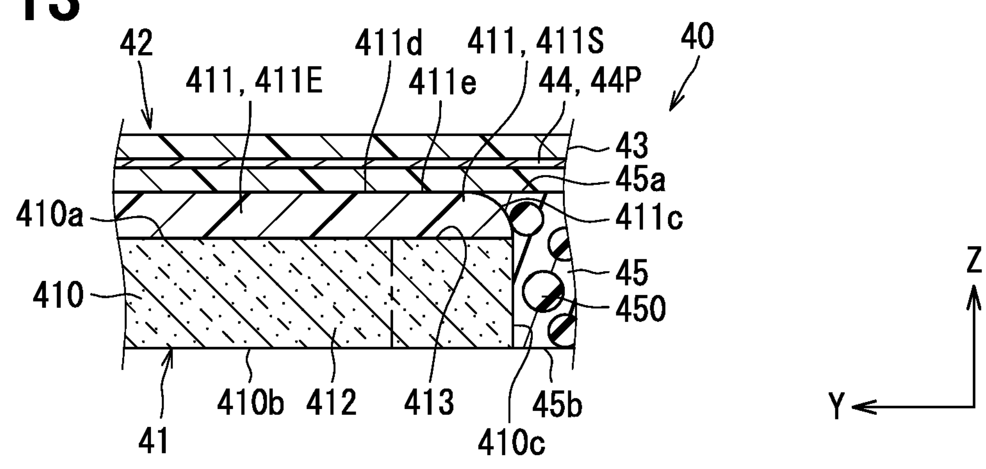
FIG. 13 is a diagram showing a cross-sectional view of an element package of a semiconductor device according to a third embodiment.

FIG. 13 is a cross-sectional view showing the structure of the element package 40 in the semiconductor device 20 according to the present embodiment. FIG. 13 shows a part corresponding to the part shown in FIG. 7. As shown in FIG. 13, a protective film 411 is arranged above the scribe region 413 on the first surface 410*a* of the semiconductor substrate 410. The protective film 411 is arranged not only above the element region 412 but also above the scribe region 413.

A portion of the protective film 411 that overlaps with the element region 412 in the plan view, that is, a portion of the protective film 411 above the element region 412 is hereinafter referred to as a protective film 411E. A portion of the protective film 411 that overlaps the scribe region 413 in the plan view, that is, a portion of the protective film 411 above the scribe region 413 is referred to as a protective film 411S. The protective film 411S covers the entirety of the first surface 410*a* above the scribe region 413. The protective film 411S is in close contact with the first surface 410*a* above the scribe region 413.

The upper surface 411*e* of the protective film 411S connects to and is substantially flush with the edge portion 411*d* of the upper surface of the protective film 411E. The edge portion 411*d* of the protective film 411E is a portion within a predetermined range from the boundary with the protective film 411S, that is, the outer peripheral edge of the protective film 411E. The protective films 411E and 411S are integrally formed using the same material. Specifically, the protective films 411E and 411S are formed in a single step by spin coating using polyimide.

On the first surface side of the semiconductor element 41, only the source electrode 41S and the pads 41P are exposed from the protective film 411. The first surface 410*a* of the semiconductor substrate 410 is not exposed from the protective film 411. The sealing resin body 45 is in contact with, that is, closely contacts to the protective film 411S. The sealing resin body 45 is in contact with, that is, closely contacts with the outer peripheral edge of the protective film 411S, that is, the side surface 411*c* on the outer periphery of the protective film 411. The first surface 45*a* of the sealing resin body 45 connects to and is substantially flush with the upper surface 411*e* of the protective film 411S. Other configurations are the same as those described in the preceding embodiment.

Summary of Third Embodiment

The element package 40 and the semiconductor device 20 of the present embodiment can achieve the similar effects to those achieved by the configurations described in the first embodiment. Specifically, as described above, the protective film 411S is provided above the scribe region 413 on the first surface 410*a* of the semiconductor substrate 410. The protective film 411S has a height not exceeding the edge portion 411*d* of the upper surface of the protective film 411E on the element region 412. The protective film 411S substantially fills the step between the edge portion 411*d* and the first surface 410*a* above the scribe region 413. The redistribution layer 42 is arranged above the upper surface of the protective film 411E including the edge portion 411*d* and the upper surface 411*e* of the protective film 411S so as to extend over the boundary between the element region 412 and the scribe region 413.

Therefore, the flatness of the redistribution layer 42 can be improved as compared with the configuration in which the protective film 411S is not arranged above the scribe region 413. Specifically, the flatness of the redistribution layer 42 can be improved in the vicinity directly above the boundary between the element region 412 and the scribe region 413.

Since the protective film 411S described above is arranged, it is possible to restrict the sealing resin body 45, that is, the filler 450 from entering the opposing region between the support substrate 100 and the scribe region 413 of the semiconductor substrate 410, when molding the sealing resin body 45 as shown in FIG. 8 of the preceding embodiment. Therefore, even if the sealing resin body 45 containing the filler 450 is used, the flatness of the redistribution layer 42 can be improved.

In the present embodiment, the protective film 411S covers the scribe region 413, and the sealing resin body 45 is in contact with the side surface 411*c* of the protective film 411S. As a result, a stepped structure portion is not formed between the semiconductor element 41 and the sealing resin body 45 at the end portion of the first surface 410*a* of the semiconductor substrate 410. Therefore, the flatness of the redistribution layer 42 can be improved in the vicinity directly above the end portion of the first surface 410*a* of the semiconductor substrate 410.

In the present embodiment, the protective film 411S provides an insulating portion stacked on the scribe region 413. The protective film 411S continues to the protective film 411E. Since it is not necessary to provide a member separate from the protective film 411, the configuration of the element package 40 can be simplified. Also, the manufacturing process can be simplified. In addition, the protective film 411S made of polyimide has higher adhesion to the sealing resin body 45 than that to the semiconductor substrate 410. Therefore, even if the sealing resin body 45 is peeled off from the side surface 410*c*, the progress of peeling can be suppressed by the protective film 411S.

In the present embodiment, the upper surface 411*e* of the protective film 411S connects to and is substantially flush with the edge portion 411*d* of the upper surface of the protective film 411E. The height of the protective film 411 in the Z direction with respect to the first surface 410*a* is substantially equal between the upper surface 411*e* and the edge portion 411*d*. With such a substantially flush configuration, the redistribution layer 42 is substantially flat in the vicinity directly above the boundary between the element region 412 and the scribe region 413. That is, flatness can be further improved.

In the present embodiment, the signal wiring 44P extends over the boundary between the element region 412 and the scribe region 413 in the plan view. However, since the protective film 411S is arranged above the scribe region 413, it is less likely that the thickness of the signal wiring 44P will be reduced or the signal wiring 44P will be disconnected in the vicinity directly above the boundary. Therefore, the electrical connection reliability between the pad 41P and the signal terminal 72 can be improved while simplifying the connection structure by eliminating the bonding wire. By eliminating the bonding wires, wire sweep and disconnection do not occur during molding of the sealing resin body 30.

In the present embodiment, the semiconductor element 41 is formed with the MOSFET 11, which is a power switching element, and the thickness of the protective film 411E is as thick as ten and several micrometers. However, the protective film 411S is arranged above the scribe region 413. Therefore, the flatness of the redistribution layer 42 can be improved while having a large step between the edge portion 411*d* and the first surface 410*a*.

Modification

Although the example in which the upper surface 411*e* of the protective film 411S arranged above the scribe region 413 continues to the edge portion 411*d* of the upper surface of the protective film 411E in a substantially flush manner has been described above, the present disclosure is not limited to such an example. Although illustration is omitted, the protective film 411S may be provided such that the upper surface 411*e* is positioned lower than the edge portion 411*d*, similar to the configuration shown in FIG. 10. Also in such a configuration, the flatness of the redistribution layer 42 can be improved, as compared with the configuration in which the protective film 411S is not arranged above the scribe region 413.

Fourth Embodiment

A fourth embodiment is a modification of the preceding embodiments as a basic configuration and may incorporate descriptions of the preceding embodiments. In the preceding embodiments, the sealing resin body and the protective film are provided above the scribe region 413. Alternatively, a resin film other than the sealing resin body and the protective film may be provided.

Figure 14:
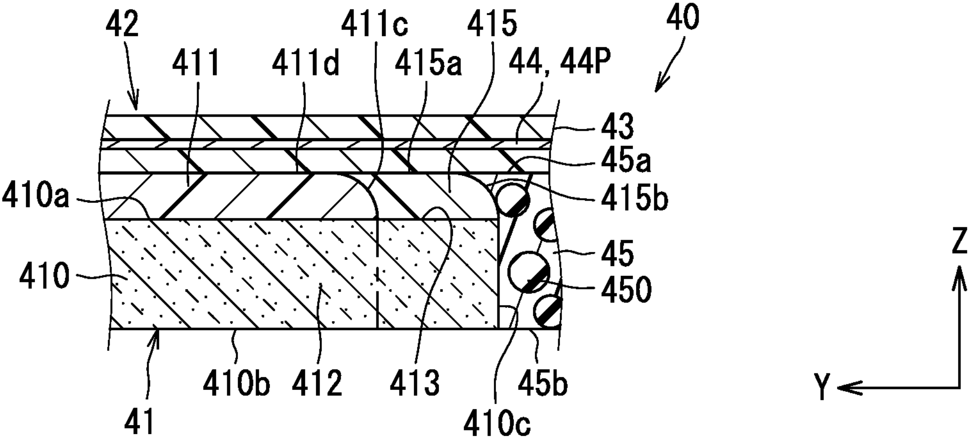
FIG. 14 is a diagram showing a cross-sectional view of an element package of a semiconductor device according to a fourth embodiment.

FIG. 14 is a cross-sectional view showing the structure of the element package 40 in the semiconductor device 20 according to the present embodiment. FIG. 14 shows a part corresponding to the part shown in FIG. 7. As shown in FIG. 14, the semiconductor element 41 has a resin film 415 different from the protective film 411 arranged above the scribe region 413 on the first surface 410*a* of the semiconductor substrate 410. The resin film 415 is not formed integrally with the protective film 411 in a single process, but is additionally formed after the protective film 411 is formed.

The resin film 415 may be formed using the same material as the protective film 411, such as polyimide. The resin film 415 may be formed using a resin material different from that of the protective film 411. The different resin material preferably has a coefficient of linear expansion close to that of the material of the protective film 411. In the present embodiment, the resin film 415 is the same material, that is, the polyimide, as the protective film 411. The resin film 415 is formed by, for example, a dispensing method.

The resin film 415 covers the entirety of the first surface 410*a* above the scribe region 413. The resin film 415 is in close contact with the first surface 410*a* of the scribe region 413. The resin film 415 is in contact with, that is, closely contacts to the side surface 411*c* of the protective film 411. The upper surface 415*a* of the resin film 415 connects to and is substantially flush with the edge portion 411*d* of the upper surface of the protective film 411.

The sealing resin body 45 is in contact with, that is, closely contacts with the resin film 415. The sealing resin body 45 is in contact with, that is, closely contacts with the side surface 415*b* of the resin film 415 on the outer peripheral side. The first surface 45*a* of the sealing resin body 45 connects to the upper surface 415*a* of the resin film 415 so as to be substantially flush with each other. Other configurations are similar to those of the preceding embodiments.

Summary of Fourth Embodiment

The element package 40 and the semiconductor device 20 of the present embodiment can achieve effects according to the configuration described in the third embodiment. Specifically, as described above, the additional resin film 415 is provided above the scribe region 413 on the first surface 410*a* of the semiconductor substrate 410. The resin film 415 has a height not exceeding the edge portion 411*d* of the upper surface of the protective film 411. The resin film 415 substantially fills the step between the edge portion 411*d* and the first surface 410*a* above the scribe region 413. The redistribution layer 42 is arranged above the upper surface of the protective film 411 including the edge portion 411*d* and the upper surface 415*a* of the resin film 415 so as to extend over the boundary between the element region 412 and the scribe region 413.

Therefore, the flatness of the redistribution layer 42 can be improved as compared with the configuration in which the resin film 415 is not arranged above the scribe region 413. Specifically, the flatness of the redistribution layer 42 can be improved in the vicinity directly above the boundary between the element region 412 and the scribe region 413. Since the resin film 415 is arranged as described above, it is possible to suppress the sealing resin body 45, that is, the filler 450, from entering the opposing region between the support substrate 100 and the scribe region 413 of the semiconductor substrate 410 when molding the sealing resin body 45, as in the preceding embodiment shown in FIG. 8. Therefore, even though the sealing resin body 45 containing the filler 450 is used, the flatness of the redistribution layer 42 can be improved.

In the present embodiment, the resin film 415 covers the scribe region 413 and the sealing resin body 45 is in contact with the side surface 415*b* of the resin film 415. As a result, a stepped structure portion is not formed between the semiconductor element 41 and the sealing resin body 45 at the end portion of the first surface 410*a* of the semiconductor substrate 410. Therefore, the flatness of the redistribution layer 42 can be improved in the vicinity directly above the end portion of the first surface 410*a* of the semiconductor substrate 410.

In the present embodiment, the resin film 415 provides an insulating portion stacked above the scribe region 413. The resin film 415 is in contact with the side surface 411*c* of the protective film 411. Since the resin film 415 is made of the same material as the protective film 411, the configuration of the element package 40 can be simplified. The resin film 415 has higher adhesion to the sealing resin body 45 than that to the semiconductor substrate 410. In particular, the resin film 415 made of polyimide has high adhesion to the sealing resin body 45. Therefore, even if the sealing resin body 45 is peeled off from the side surface 410*c*, the progress of the peeling can be suppressed by the resin film 415.

In the present embodiment, the upper surface 415*a* of the resin film 415 connects to the edge portion 411*d* of the upper surface of the protective film 411 so as to be substantially flush with each other. The height in the Z direction with respect to the first surface 410*a* is substantially equal between the upper surface 415*a* and the edge portion 411*d*. With such a substantially flush configuration, the redistribution layer 42 is substantially flat in the vicinity directly above the boundary between the element region 412 and the scribe region 413. That is, the flatness can be further improved.

In the present embodiment, the signal wiring 44P extends across the boundary between the element region 412 and the scribe region 413 in the plan view. However, since the resin film 415 is arranged above the scribe region 413, it is less likely that the thickness of the signal wiring 44P will be reduced or the signal wiring 44P will be disconnected in the vicinity directly above the boundary. Therefore, the electrical connection reliability between the pad 41P and the signal terminal 72 can be improved while simplifying the connection structure by eliminating the bonding wire. By eliminating the bonding wires, wire sweep and disconnection do not occur during molding of the sealing resin body 30.

In the present embodiment, the semiconductor element 41 is formed with the MOSFET 11, which is a power switching element, and the thickness of the protective film 411 is as thick as ten and several micrometers. However, the resin film 415 is arranged above the scribe region 413. Therefore, the flatness of the redistribution layer 42 can be improved while having a large step between the edge portion 411*d* and the first surface 410*a*.

Modification

Although the example in which the upper surface 415*a* of the resin film 415 arranged above the scribe region 413 connects to the edge portion 411*d* of the upper surface of the protective film 411 in a substantially flush manner has been described, the present disclosure is not limited to such an example. Although not shown, the resin film 415 may be provided such that the upper surface 415*a* is positioned lower than the edge portion 411*d*, similar to the configuration shown in FIG. 10. Even with such a configuration, the flatness of the redistribution layer 42 can be improved as compared with a configuration in which the resin film 415 is not arranged above the scribe region 413.

Figure 15:
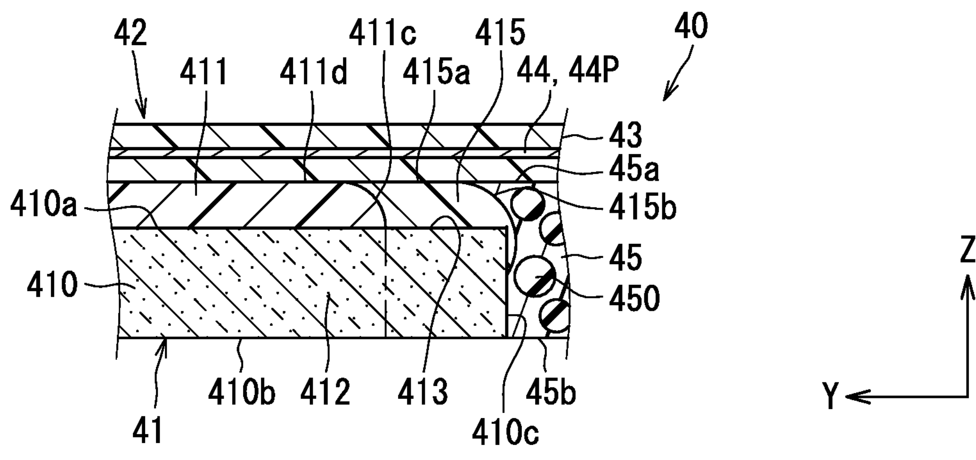
FIG. 15 is a diagram showing a cross-sectional view of an element package according to a modification.

As shown in FIG. 15, the resin film 415 may be provided so as to partially cover the side surface 410*c* of the semiconductor substrate 410. The resin film 415 integrally covers the first surface 410*a* of the scribe region 413 and a part of the side surface 410*c* that is continuous from the first surface 410*a*. As described above, since the resin film 415 has high adhesion to the sealing resin body 45, it is possible to suppress the progress of peeling of the sealing resin body 45 in a middle of the side surface 410*c*.

Fifth Embodiment

A fifth embodiment is a modification of the preceding embodiments as a basic configuration and may incorporate descriptions of the preceding embodiments. In the preceding embodiments, no particular reference is made to the surface condition of the mold element. Alternatively, the molded element may have a rough portion on the surface adjacent to the redistribution layer.

Figure 16:
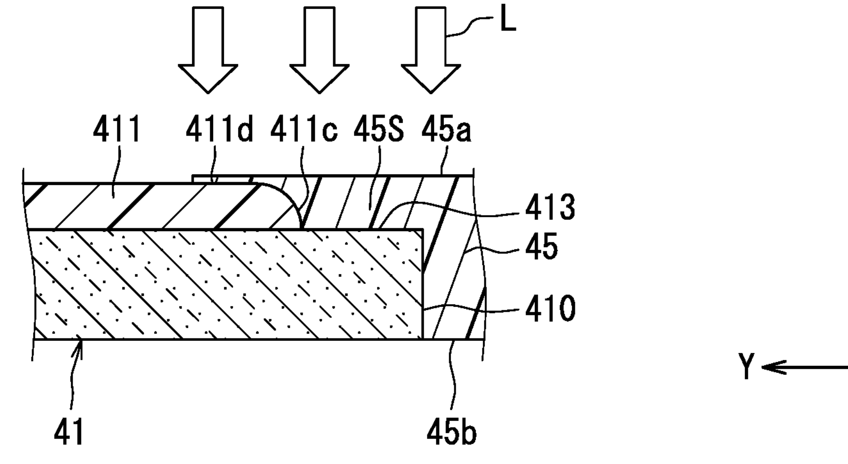
FIG. 16 is a diagram showing a cross-sectional view for explaining a method for manufacturing an element package of a semiconductor device according to a fifth embodiment.
Figure 17:
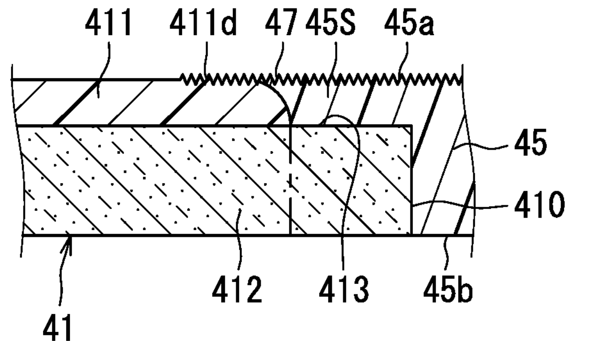
FIG. 17 is a diagram showing a cross-sectional view of the element package of the semiconductor device according to the fifth embodiment.
Figure 17:
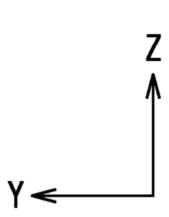

FIG. 16 is a cross-sectional view showing the element package 40 after the sealing resin body 45 is molded. FIG. 17 is a cross-sectional view showing the structure of the element package 40 in the semiconductor device 20 according to the present embodiment. FIG. 16 and FIG. 17 show parts corresponding to the part shown in FIG. 7. In FIG. 17, the redistribution layer 42 is not shown for the sake of convenience.

As shown in FIG. 16, in the case where the sealing resin body 45 is molded so as to cover at least the edge portion 411*d* of the upper surface of the protective film 411, the sealing resin body 45 is removed from the first surface 45*a* side. For example, a laser beam L is applied to the first surface 45*a* of the sealing resin body 45. As a result, the sealing resin body 45 on the protective film 411 is removed. As another example, the laser beam L is applied to the protective film 411 and the sealing resin body 45 so that at least the edge portion 411*d* of the upper surface of the protective film 411 and at least the first surface 45*a* of the sealing resin body 45S are substantially flush with each other.

Thus, as shown in FIG. 17, a rough portion 47 is formed on at least the edge portion 411*d* and the first surface 45*a* of the sealing resin body 45S, on the upper surface of the protective film 411 and the first surface 45*a* of the sealing resin body 45. The molded element has the rough portion 47 on the surface adjacent to the redistribution layer 42. The rough portion 47 is formed continuously over the edge portion 411*d* of the protective film 411 and the first surface 45*a* of the sealing resin body 45S. The edge portion 411*d* of the protective film 411 and the first surface 45*a* of the sealing resin body 45S are substantially flush with each other in a roughened state. The sealing resin body 45 of the present embodiment has the similar rough portion 47 on the first surface 45*a* of the portion other than the sealing resin body 45S. Other configurations are similar to those of the preceding embodiments.

Summary of Fifth Embodiment

In the present embodiment, the upper surface of the protective film 411 and the first surface 45*a* of the sealing resin body 45S are continuously roughened so as to extend over the boundary between the element region 412 and the scribe region 413 in the plan view. Even in the configuration having the rough portion 47 rather than the flat portion, the similar effects to those achieved in the configuration described as the preceding embodiments can be achieved. Furthermore, since the molded element has the rough portion 47 on the surface, the adhesion between the molded element and the redistribution layer 42 can be improved.

Modification

The means for forming the rough portion 47 is not limited to the laser beam irradiation.

Figure 18:
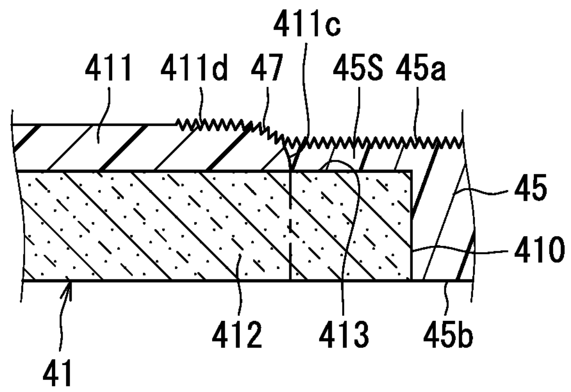
FIG. 18 is a diagram showing a cross-sectional view of an element package according to a modification.
Figure 18:
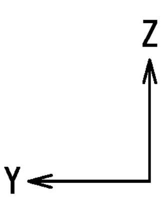

As shown in FIG. 18, the rough portion 47 of the present embodiment may be combined with the configuration shown in FIG. 10 of the preceding embodiment. The sealing resin body 45 is provided so that the first surface 45*a* of the sealing resin body 45S is positioned lower than the edge portion 411*d*. The rough portion 47 is formed continuously from the protective film 411 to the first surface 45*a* of the sealing resin body 45S. The rough portion 47 is also formed on the side surface 411*c* of the protective film 411. Thus, the edge portion 411*d*, the upper portion of the side surface 411*c*, and the first surface 45*a* are continuously roughened. Due to the irradiation of the protective film 411 with the laser beam, the slope of the upper portion of the side surface 410*c* is gentle. Therefore, the flatness of the redistribution layer 42 can be improved in the vicinity directly above the boundary between the element region 412 and the scribe region 413.

Sixth Embodiment

A sixth embodiment is a modification of the preceding embodiments as a basic configuration and may incorporate descriptions of the preceding embodiments. In the preceding embodiments, the flatness of the redistribution layer 43 is improved by providing the insulating portion above the scribe region 413. Alternatively, it may be possible to form so that the step may not be generated.

Figure 19:
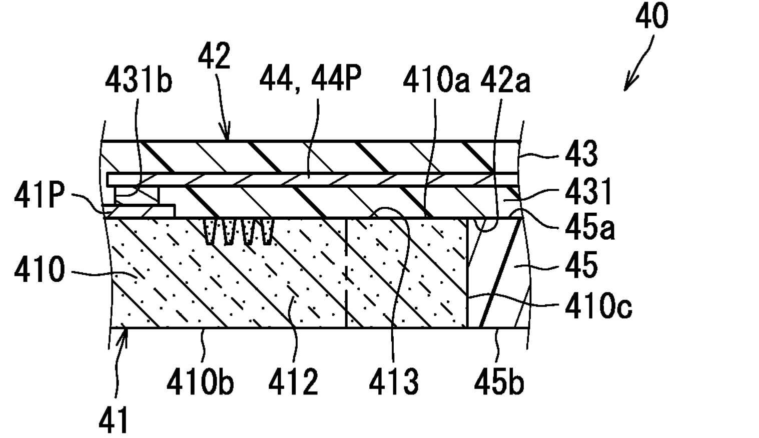
FIG. 19 is a diagram showing a cross-sectional view of an element package of a semiconductor device according to a sixth embodiment.
Figure 19:
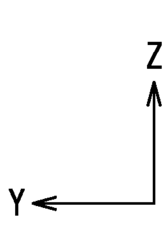

FIG. 19 is a cross-sectional view showing the structure of the element package 40 of the semiconductor device 20 according to the present embodiment. FIG. 19 shows a part corresponding to the part VII shown in FIG. 6, but includes an area around the pad 41P. That is, FIG. 19 shows the part after expanding toward the pad 41P side than that in FIG. 7. In FIG. 19, illustrations of the drain electrode 41D and the electrode protective material 46 are omitted. For the sake of convenience, the redistribution layer 42 is shown flat in the vicinity directly above the pad 41P.

As shown in FIG. 19, the semiconductor element 41 does not have the protective film 411 shown in the preceding embodiments. The insulator 43 of the redistribution layer 42 is made of polyimide. The insulating film 431 being on the first layer and forming the insulator 43 serves as the protective film 411. The insulating film 431 covers the peripheral edge portion of the pad 41P. The pad 41P is exposed through the opening 431*b* of the insulating film 431. Although not shown, the insulating film 431 covers the peripheral edge portion of the source electrode 41S. The source electrode 41S is exposed through the opening 431*a* of the insulating film 431.

The insulating film 431 covers the first surface 410*a* of the semiconductor substrate 410 except for the electrode formation region where the electrode is formed. The insulating film 431 also covers the element region 412, the scribe region 413, and the boundary between the element region 412 and the scribe region 413 on the first surface 410*a*. The first surface 45*a* of the sealing resin body 45 is substantially flush with the first surface 410*a* of the semiconductor substrate 410. The sealing resin body 45 is in contact with, that is, closely contacts with, of the surfaces of the semiconductor substrate 410, only the side surface 410*c*. The sealing resin body 45 is in close contact with the entirety of the side surface 410*c*. Other configurations are similar to those of the preceding embodiments described hereinabove.

Summary of Sixth Embodiment

As described above, in the sixth embodiment, the protective film 411 is eliminated from the semiconductor element 41. Therefore, a stepped structure portion between the upper surface of the protective film 411 and the first surface 410*a* of the scribe region 413 is not formed. Further, there is no gap occurs above the scribe region 413, to which a resin will enter when molding the sealing resin body 45. Therefore, the insulator 43 of the redistribution layer 42 is in contact with the first surface 410*a* of the semiconductor substrate 410 over the element region 412 and the scribe region 413. That is, the redistribution layer 42 is substantially flat in the vicinity directly above the boundary between the element region 412 and the scribe region 413. Therefore, the flatness of the redistribution layer 42 can be effectively improved in the vicinity directly above the boundary between the device region 412 and the scribe region 413. Since the protective film 411 is eliminated, the flatness of the redistribution layer 42 can be improved with a simple structure.

In the present embodiment, the first surface 410*a* of the semiconductor substrate 410 and the first surface 45*a* of the sealing resin body 45 are substantially flush with each other. Therefore, the flatness of the redistribution layer 42 can be improved in the vicinity directly above the end portion of the first surface 410*a* of the semiconductor substrate 410.

In the present embodiment, the signal wiring 44P connected to the pad 41P of the semiconductor element 41 extends over the boundary between the element region 412 and the scribe region 413 in the plan view. However, by eliminating the protective film 411, it is possible to suppress the thickness of the signal wiring 44P from being reduced and the signal wiring 44P from being disconnected in the vicinity directly above the boundary. Therefore, the electrical connection reliability between the pad 41P and the signal terminal 72 can be improved while simplifying the connection structure by eliminating the bonding wire. By eliminating the bonding wire, wire sweep or disconnection do not occur during molding of the sealing resin body 30.

In the present embodiment, the semiconductor element 41 is formed with a MOSFET 11, which is a power switching element. The semiconductor element 41 constitutes the inverter 6, which is a power conversion circuit. Since the insulator 43 of the redistribution layer 42 functions as the protective film 411, the step due to the protective film 411 does not occur as described above. Therefore, the flatness of the redistribution layer 42 can be improved.

Seventh Embodiment

A seventh embodiment is a modification of the preceding embodiments as a basic configuration and may incorporate descriptions of the preceding embodiments. In the preceding embodiments, the sealing resin body is positively arranged above the scribe region 413. Alternatively, the sealing resin body above the scribe region 413 may be removed.

The sealing resin body 45 arranged above the scribe region 413 may crack as resin burrs or fall off. In the present embodiment, the sealing resin body 45 above the scribe region 413 is removed by irradiation with a laser beam or the like. In addition, the peripheral protective film 411 and a part of the sealing resin body 45 outside the scribe region 413 are also removed.

Specifically, a laser beam is applied from the first surface 45*a* side to the sealing resin body 45 above the scribe region 413 and the sealing resin body 45 located opposite to the scribe region 413 with respect to the end portion of the semiconductor substrate 410. In this manner, the laser beam is applied to a predetermined region extending over the end portion of the semiconductor substrate 410 to remove the sealing resin body 45. Further, the laser beam is applied to at least a part of the side surface 411*c* and the edge portion 411*d* of the protective film 411.

Figure 20:
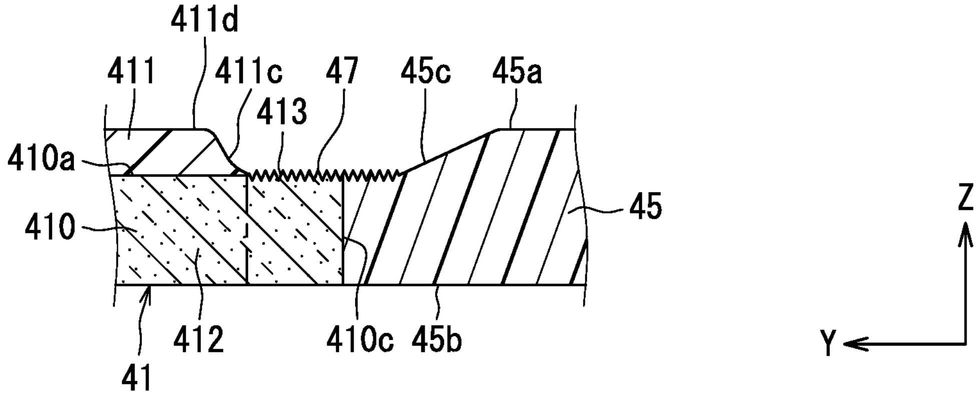
FIG. 20 is a diagram showing a cross-sectional view of an element package of a semiconductor device according to a seventh embodiment.

FIG. 20 is a cross-sectional view showing the structure of the element package 40 of the semiconductor device 20 according to the present embodiment. FIG. 20 shows a part corresponding to the part shown in FIG. 10. In FIG. 20, illustration of the sealing resin body 45 is more expanded, as compared to that shown in FIG. 10. FIG. 20 shows the state after a removal processing.

On the first surface 410*a* of the semiconductor substrate 410, the sealing resin body 45 above the scribe region 413 is completely removed. The sealing resin body 45 is not arranged at a position overlapping the semiconductor substrate 410 in the plan view. A rough portion 47 is formed on the first surface 410*a* of the scribe region 413 by the irradiation with the laser beam. The protective film 411 has a tapered or sloped shape with an inclination smaller than that before the irradiation with the laser beam. The protective film 411 may have the rough portion 47 on the surface irradiated with the laser beam. For example, the side surface 411*c* may have the rough portion 47.

The sealing resin body 45 on the side opposite to the scribe region 413 with respect to the end portion (side surface 410*c*) of the semiconductor substrate 410 is also removed in the same manner as the sealing resin body 45 above the scribe region 413. The sealing resin body 45 has a recess 45*c* at an end portion adjacent to the semiconductor element 41 on the first surface 45*a*. The bottom surface of the recess 45*c* connects to the first surface 410*a* of the semiconductor substrate 410 to be substantially flush with the first surface 410*a*. The bottom surface of the recess 45*c* is formed with the rough portion 47. The side surface of the recess 45*c* is inclined. The sealing resin body 45 may have the rough portion 47 on the side surface of the recess 45*c*.

At least the edge portion 411*d* of the upper surface of the protective film 411 and the first surface 45*a* of the sealing resin body 45 excluding the wall surface of the recess 45*c* are at the same position in the Z direction. The side surface 411*c* of the protective film 411, the scribe region 413 of the first surface 410*a* of the semiconductor substrate 410, and the recess 45*c* of the sealing resin body 45 form a conical shape.

Summary of Seventh Embodiment

In the present embodiment, since the sealing resin body 45 above the scribe region 413 is removed, it is possible to suppress an occurrence of cracks, detachment, and the like of the resin burr. Also, the filler 450 is not arranged in the opposing region between the redistribution layer 42 and the scribe region 413. Similar to the embodiments described above, it is possible to suppress the defects in the redistribution layer 42 due to the filler 450.

In the present embodiment, the first surface 410*a* of the semiconductor substrate 410 and the first surface 45*a* of the sealing resin body 45 of the element package 40 are connected to each other to be substantially flush with each other by removing the sealing resin body 45. Therefore, the flatness of the redistribution layer 42 can be improved in the vicinity directly above the end portion of the first surface 410*a* of the semiconductor substrate 410.

In the present embodiment, the inclination of the side surface 411*c* of the protective film 411 is gentler than that before the removal processing by the processing. As a result, the flatness of the redistribution layer 42 can be improved in the vicinity directly above the boundary between the element region 412 and the scribe region 413, as compared with the steep slope before the processing.

In the resent embodiment, the rough portion 47 is formed on the semiconductor substrate 410 and the sealing resin body 45. Therefore, the adhesion between the mold element and the redistribution layer 42 can be improved. For example, it is possible to suppress peeling of the insulator 43 from the molded element.

Although the example in which removal processing is performed by the irradiation with the laser beam has been described, the present disclosure is not limited to such an example. The removal processing may be implemented by an etching or the like.

Eighth Embodiment

An eighth embodiment is a modification of the preceding embodiments as a basic configuration and may incorporate descriptions of the preceding embodiments. In the preceding embodiment, a part of the sealing resin body is removed after molding. Alternatively, a support substrate may be used when molding the sealing resin body.

Figure 21:
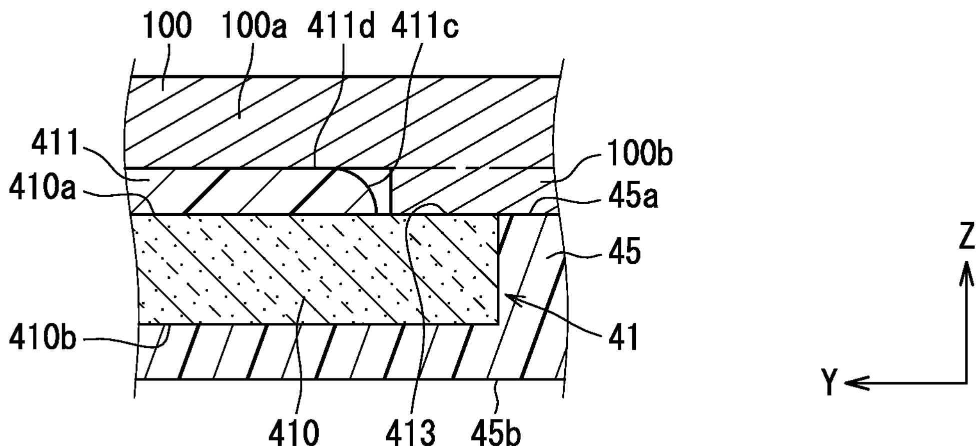
FIG. 21 is a diagram showing a cross-sectional view for explaining a method for manufacturing an element package of a semiconductor device according to an eighth embodiment.

FIG. 21 is a cross-sectional view showing a method for manufacturing the element package 40 of the semiconductor device 20 according to the present embodiment. FIG. 21 shows a part corresponding to the part shown in FIG. 8. As shown in FIG. 21, a support substrate 100 has a base portion 100*a* and a projected portion 100*b* projecting from the base portion 100*a* toward the semiconductor element 41 side. A part of the projected portion 100*b* may be composed of an adhesive layer. Alternatively, the entirety of the projected portion 100*b* may be composed of the adhesive layer.

The base portion 100*a* is in contact with the upper surface of the protective film 411 including the edge portion 411*d*. The tip surface of the projected portion 100*b* is a surface substantially parallel to the XY plane. A part of the tip surface of the projected portion 100*b* is in contact with the first surface 410*a* of the semiconductor substrate 410 in the scribe region 413. The projected portion 100*b* is in contact with at least a part of the first surface 410*a*, which is in a predetermined region from the end portion, above the scribe region 413. The projected portion 100*b* is in contact with the scribe region 413 without any gaps on an entire perimeter. The remaining portion of the tip surface of the projected portion 100*b* is arranged adjacent to a region where the sealing resin body 45 is formed so as to define the first surface 45*a* of the sealing resin body 45.

Summary of Eighth Embodiment

In the present embodiment, the support substrate 100 having the projected portion 100*b* is used. As described above, the projected portion 100*b* is in contact with the scribe region 413 without gaps around the entire perimeter. Therefore, it is possible to suppress leak of the resin to the scribe region 413 during molding of the sealing resin body 45. Therefore, it is possible to suppress the occurrence of crack, detachment, or the like due to the resin burr. In addition, since the filler 450 is not arranged in the opposing region between the redistribution layer 42 and the scribe region 413, it is possible to suppress the defects in the redistribution layer 42 due to the filler 450.

In the present embodiment, the tip surface of the projected portion 100*b* is flat, and a part of the tip surface defines the first surface 45*a* of the sealing resin body 45. As a result, the first surface 45*a* of the molded sealing resin body 45 is connected to the first surface 410*a* of the scribe region 413 so as to be substantially flush with each other. Therefore, the flatness of the redistribution layer 42 can be improved in the vicinity directly above the end portion of the first surface 410*a* of the semiconductor substrate 410.

Other Embodiments

The present disclosure is not limited to the embodiments indicated in this specification, the drawings, and the like. The present disclosure encompasses the illustrated embodiments and modifications thereof made by those skilled in the art. For example, the present disclosure is not limited to the combinations of components and/or elements shown in the embodiments. The present disclosure may be implemented in various combinations. The present disclosure may have additional parts that may be added to the embodiments. The present disclosure encompasses omission of components and/or elements of the embodiments. The present disclosure encompasses the replacement or combination of components and/or elements between one embodiment and another. The disclosed technical scopes are not limited to the descriptions of the embodiments. It should be understood that a part of disclosed technical scopes is indicated by claims, and the present disclosure further includes modifications within an equivalent scope of the claims.

The disclosures in the specification, drawings and the like is not limited by the description of the claims. The disclosure in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

As used herein, the term "and/or" includes any combination and all combinations relating to one or more of the related listed items. For example, the term A and/or B includes only A, only B, or both A and B.

Spatial relative terms "inside", "outside", "rear", "bottom", "low", "top", "high", and the like are used herein to facilitate the description that describes relationships between one element or feature and another element or feature. Spatial relative terms can be intended to include different orientations of a device in use or operation, in addition to the orientations depicted in the drawings. For example, when a device in a drawing is turned over, elements described as "below" or "directly below" are oriented "above" the other elements or features. Therefore, the term "below" can include both above and below. The device may be oriented in another direction (rotated 90 degrees or in any other direction) and the spatially relative terms used herein are interpreted accordingly.

The drive system 1 for a vehicle is not limited to the structures of the embodiments described above. The drive system 1 having one motor generator 3 is exemplified. However, the drive system 1 is not limited to such an example. The drive system 1 may have multiple motor generators. The example in which the power conversion device 4 includes the inverter 6 as a power conversion circuit is described. However, the power conversion device 4 is not limited to such an example. For example, the power conversion device 4 may have multiple inverters. As another example, the power conversion device 4 may have at least one inverter and a converter. As further another example, the power conversion device 4 may have a converter only.

The semiconductor device 20 having one semiconductor element 41 forming one arm has been exemplified. However, the semiconductor device 20 is not limited to such an example. The semiconductor device 20 may have multiple semiconductor elements 41 constituting the higher and lower arm circuit 9 for one phase. The semiconductor device 20 may have multiple semiconductor elements 41 constituting the higher and lower arm circuits 9 for multiple phases. In a case where multiple semiconductor elements 41 are connected in parallel to form one arm, for example, multiple semiconductor elements 41 may be arranged on a single element package 40.

The example in which the semiconductor element 41 has the MOSFET 11 as the switching element has been described. However, the switching element is not limited to the MOSFET 11. For example, the semiconductor element 41 may have an IGBT as the switching element.

The example in which the semiconductor element 41 has the source electrode 41S on the first surface of the semiconductor substrate 410 and the drain electrode 41D on the second surface as the main electrodes has been described. However, the semiconductor element 41 is not limited to such a configuration. The semiconductor element 41 may have main electrodes only on the first surface.

The example in which the terminal portion 440P of the signal wiring 44P is exposed on the back surface 42*b* side of the redistribution layer 42 has been described. However, the present disclosure is not limited to such a configuration. The region to form the sealing resin body 45 may be limited, so that the terminal portion 440P is exposed from the unsealed portion of the mounting surface 42*a*.

Although the example in which the back surfaces 50*b* and 60*b* of the heat dissipation members 50 and 60 are exposed from the sealing resin body 30 has been described, the present disclosure is not limited to such a configuration. For example, at least one of the back surfaces 50*b* and 60*b* may be covered by the sealing resin body 30. As another example, at least one of the back surfaces 50*b* and 60*b* may be covered by another insulating member (not shown) different from the sealing resin body 30. Although the example in which the semiconductor device 20 has the sealing resin body 30 has been described, the present disclosure is not limited to such a configuration. The semiconductor device 20 may not have the sealing resin body 30. The semiconductor device 20 may include at least the element package 40.

What is claimed is:

1. An element package comprising:

a semiconductor element that includes a semiconductor substrate, a main electrode, a pad, and a protective film, the semiconductor substrate having an element region formed with an element and a scribe region disposed in a predetermined area from an end portion of the semiconductor substrate and surrounding the element region, the main electrode and the pad being disposed on a surface of the semiconductor substrate, the protective film being disposed above the element region on the surface of the semiconductor substrate so that the main electrode and the pad are exposed from the protective film;

a sealing resin body that seals the semiconductor element so that the main electrode and the pad are exposed from the sealing resin body;

a redistribution layer that is disposed adjacent to the surface of the semiconductor substrate with respect to the semiconductor element, and includes an insulator and a wiring disposed in the insulator; and an insulating portion that is disposed above the scribe region on the surface of the semiconductor element with a height that does not exceed an outer peripheral edge portion of an upper surface of the protective film on the element region, wherein the redistribution layer is disposed to extend over the protective film and the insulating portion.

2. The element package according to claim 1, wherein the insulating portion is disposed to be flush with the outer peripheral edge portion of the protective film.

3. The element package according to claim 1, wherein the insulating portion is provided by a part of the sealing resin body disposed above the scribe region, and the sealing resin body is in contact with a side surface of the protective film.

4. The element package according to claim 3, wherein the sealing resin body contains a filler, and the filler has a particle diameter that is greater than a height of a step defined between the outer peripheral edge portion of the protective film and the surface of the semiconductor substrate defining the scribe region.

5. The element package according to claim 4, wherein the outer peripheral edge portion of the protective film and an upper surface of the sealing resin body have a rough portion that extends over a boundary between the element region and the scribe region in a plan view in a thickness direction of the semiconductor substrate.

6. The element package according to claim 1, wherein the insulating portion is provided by a part of the protective film disposed above the scribe region.

7. The element package according to claim 2, wherein the insulating portion is a resin film provided as a part different from the sealing resin body and the protective film, and the resin film covers the scribe region on the surface of the semiconductor substrate and is in contact with a side surface of the protective film.

8. The element package according to claim 1, wherein the element is a power switching element.

9. The element package according to claim 1, wherein the wiring includes a signal wiring connected to the pad, and the signal wiring is disposed to extend over a boundary between the element region and the scribe region in a plan view in a thickness direction of the semiconductor substrate.

10. A semiconductor device comprising:

an element package;

a heat dissipation member; and a signal terminal, wherein the element package includes:

a semiconductor element that includes a semiconductor substrate, a main electrode, a pad, and a protective film, the semiconductor substrate having an element region formed with an element and a scribe region disposed in a predetermined area from an end portion of the semiconductor substrate and surrounding the element region, the main electrode and the pad being disposed on a surface of the semiconductor substrate, the protective film being disposed above the element region on the surface of the semiconductor substrate so that the main electrode and the pad are exposed from the protective film;

a sealing resin body that seals the semiconductor element so that the main electrode and the pad are exposed from the sealing resin body;

a redistribution layer that includes an insulator and a wiring disposed in the insulator, and is disposed adjacent to the surface of the semiconductor substrate with respect to the semiconductor element;

an insulating portion that is disposed above the scribe region on the surface of the semiconductor element with a height that does not exceed an outer peripheral edge portion of an upper surface of the protective film on the element region, wherein the redistribution layer is disposed to extend over the protective film and the insulator, the wiring includes a signal wiring connected to the pad, the signal wiring is disposed to extend over a boundary between the element region and the scribe region in a plan view in a thickness direction of the semiconductor substrate, the heat dissipation member is disposed to interpose the semiconductor element in the thickness direction, and the signal terminal is joined to a terminal portion of the signal wiring exposed from the insulator, and is electrically connected to the pad through the signal wiring.

11. A semiconductor device comprising:

an element package;

a heat dissipation member; and a signal terminal, wherein the element package includes:

a semiconductor element that includes a semiconductor substrate, a main electrode and a pad, the semiconductor substrate having an element region formed with an element and a scribe region disposed in a predetermined area from an end portion of the semiconductor substrate and surrounding the element region, the main electrode and the pad being disposed on a surface of the semiconductor substrate;

a sealing resin body that seals the semiconductor element so that the main electrode and the pad are exposed from the sealing resin body;

a redistribution layer that is disposed adjacent to the surface of the semiconductor substrate with respect to the semiconductor element, and includes an insulator and a wiring disposed in the insulator, wherein the insulator is in contact with the surface of the semiconductor substrate over the element region and the scribe region, the wiring includes a signal wiring connected to the pad, and the signal wiring is disposed to extend over a boundary between the element region and the scribe region in a plan view in a thickness direction of the semiconductor substrate, the heat dissipation member is disposed to interpose the semiconductor element in the thickness direction, and the signal terminal is joined to a terminal portion of the signal wiring exposed from the insulator, and is electrically connected to the pad through the signal wiring.

* * * * *